(12) United States Patent
Cha et al.

(10) Patent No.: US 10,170,666 B2
(45) Date of Patent: Jan. 1, 2019

(54) LED LIGHT SOURCE MODULE AND DISPLAY DEVICE

(71) Applicant: SAMSUNG ELECTRONICS CO., LTD., Suwon-si (KR)

(72) Inventors: Nam Goo Cha, Hwaseong-si (KR); Yong Il Kim, Seoul (KR); Young Soo Park, Yongin-si (KR); Sung Hyun Sim, Uiwang-si (KR); Hanul Yoo, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/389,808

(22) Filed: Dec. 23, 2016

(65) Prior Publication Data

US 2017/0288093 A1  Oct. 5, 2017

(30) Foreign Application Priority Data

Apr. 4, 2016 (KR) .................. 10-2016-0041162

(51) Int. Cl.
*H01L 33/08* (2010.01)
*G09G 3/20* (2006.01)
(Continued)

(52) U.S. Cl.
CPC ........... *H01L 33/08* (2013.01); *G09G 3/2003* (2013.01); *H01L 25/0756* (2013.01);
(Continued)

(58) Field of Classification Search
CPC ..... H01L 33/08; H01L 33/382; H01L 33/504; H01L 33/58; H01L 33/46; H01L 33/62; H01L 25/0756; G09G 3/2003; G09G 3/32
See application file for complete search history.

(56) References Cited

U.S. PATENT DOCUMENTS 6,372,608 B1   4/2002  Shimoda et al.
6,645,830 B2  11/2003  Shimoda et al.
(Continued)

FOREIGN PATENT DOCUMENTS

CN   1170383 A   1/1998
CN   1913180 A   2/2007
(Continued)

OTHER PUBLICATIONS

Communication dated Oct. 9, 2018, issued by the Chinese Patent Office in counterpart Chinese Application No. 201710217743.8.

*Primary Examiner* — Stephen G Sherman
(74) *Attorney, Agent, or Firm* — Sughrue Mion, PLLC

(57) ABSTRACT

An LED light source module includes a light emitting stacked body, and a first through electrode structure and a second through electrode structure passing through a portion of the light emitting stacked body. The light emitting stacked body includes a base insulating layer, light emitting layers sequentially stacked on the base insulating layer, each of the light emitting layers including a first conductivity-type semiconductor layer, a second conductivity-type semiconductor layer, and an active layer disposed between the first conductivity-type semiconductor layer and the second conductivity-type semiconductor layer, and an interlayer insulating layer disposed between the light emitting layers. The first through electrode structure is connected to the first conductivity-type semiconductor layer of each of the light emitting layers, and the second through electrode structure is connected to any one or any combination of the second conductivity-type semiconductor layer of each of the light emitting layers.

17 Claims, 42 Drawing Sheets

(51) Int. Cl.
  *H01L 33/38* (2010.01)
  *H01L 33/50* (2010.01)
  *H01L 33/58* (2010.01)
  *H01L 25/075* (2006.01)
  *G09G 3/32* (2016.01)
  *H01L 33/46* (2010.01)
  *H01L 33/62* (2010.01)

(52) U.S. Cl.
  CPC .......... *H01L 33/382* (2013.01); *H01L 33/504* (2013.01); *H01L 33/58* (2013.01); *G09G 3/32* (2013.01); *H01L 33/46* (2013.01); *H01L 33/62* (2013.01); *H01L 2224/16145* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,864,627 B2 | 3/2005 | Komoto et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,110,061 B2 | 9/2006 | Komoto et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,935,972 B2 | 5/2011 | Plank |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,324,803 B2 | 12/2012 | Forrest et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,610,359 B2 | 12/2013 | Lee |
| 8,735,931 B2 | 5/2014 | Han et al. |
| 8,766,295 B2 | 7/2014 | Kim |
| 9,040,963 B2 | 5/2015 | Lee et al. |
| 9,076,929 B2 | 7/2015 | Katsuno et al. |
| 10,043,850 B2 | 8/2018 | Lin et al. |
| 2010/0220042 A1 | 9/2010 | El-Ghoroury et al. |
| 2012/0073657 A1 | 3/2012 | El-Ghoroury et al. |
| 2015/0048394 A1 | 2/2015 | Shim et al. |
| 2015/0344296 A1 | 12/2015 | Pahl |
| 2015/0372187 A1 | 12/2015 | Bower et al. |
| 2015/0380607 A1 | 12/2015 | Wu et al. |

FOREIGN PATENT DOCUMENTS

| | | |
|---|---|---|
| CN | 201134433 Y | 10/2008 |
| CN | 103296047 A | 9/2013 |
| CN | 104733487 A | 6/2015 |
| JP | 7-183576 A | 7/1995 |
| WO | 96/19792 A2 | 6/1996 |

LED LIGHT SOURCE MODULE AND DISPLAY DEVICE

CROSS-REFERENCE TO RELATED APPLICATION

This application claims priority from Korean Patent Application No. 10-2016-0041162 filed on Apr. 4, 2016, in the Korean Intellectual Property Office, the disclosure of which is incorporated herein by reference in its entirety.

BACKGROUND

1. Field

Apparatuses consistent with example embodiments relate to a light-emitting diode (LED) light source module and a display device.

2. Description of Related Art

A semiconductor LED may used as a light source for a lighting apparatus, and also as a light source of various electronic products. In detail, such a semiconductor LED is widely used as a light source for various display devices such as a television (TV), a cellular phone, a personal computer (PC), a laptop PC, a personal digital assistant (PDA), or the like.

A display device according to the related art includes a display panel commonly formed of a liquid crystal display (LCD) and a backlight unit. However, an LED device has been recently developed to have a form in which an individual LED device is used as a single pixel so that a display device does not require a separate backlight unit. Such a display device can be compact, and a high luminance display having excellent light efficiency in comparison with an LCD according to the related art can be implemented. In addition, an aspect ratio of a display screen can be freely changed and a display screen can be implemented with a large area. Therefore, a large display having various forms may be provided.

SUMMARY

According to an aspect of an example embodiment, an LED light source module includes a light emitting stacked body including a base insulating layer, and a first light emitting layer, a second light emitting layer, a third light emitting layer sequentially stacked on the base insulating layer, and configured to emit light having different wavelengths, each of the first light emitting layer, the second light emitting layer, and the third light emitting layer including a first conductivity-type semiconductor layer, a second conductivity-type semiconductor layer, and an active layer disposed between the first conductivity-type semiconductor layer and the second conductivity-type semiconductor layer. The LED light source module further includes a first interlayer insulating layer disposed between the first light emitting layer and the second light emitting layer, and a second interlayer insulating layer disposed between the second light emitting layer and the third light emitting layer. The light emitting stacked body is divided into pixel regions defined by a partition structure passing through the first light emitting layer, the second light emitting layer, the third light emitting layer, the first interlayer insulating layer, and the second interlayer insulating layer. Each of the pixel regions includes a common electrode passing through the base insulating layer, the first light emitting layer, the second light emitting layer, the first interlayer insulating layer, and the second interlayer insulating layer, and connected to the first conductivity-type semiconductor layer of each of the first light emitting layer, the second light emitting layer, and the third light emitting layer, a first individual electrode passing through the base insulating layer, and connected to the second conductivity-type semiconductor layer of the first light emitting layer, a second individual electrode passing through the base insulating layer, the first light emitting layer, and the first interlayer insulating layer, and connected to the second conductivity-type semiconductor layer of the second light emitting layer, and a third individual electrode passing through the base insulating layer, the first light emitting layer, the second light emitting layer, the first interlayer insulating layer, and the second interlayer insulating layer, and connected to the second conductivity-type semiconductor layer of the third light emitting layer.

According to an aspect of another example embodiment, an LED light source module includes a light emitting stacked body, and a first through electrode structure and a second through electrode structure passing through a portion of the light emitting stacked body. The light emitting stacked body includes a base insulating layer, light emitting layers sequentially stacked on the base insulating layer, each of the light emitting layers including a first conductivity-type semiconductor layer, a second conductivity-type semiconductor layer, and an active layer disposed between the first conductivity-type semiconductor layer and the second conductivity-type semiconductor layer, and an interlayer insulating layer disposed between the light emitting layers. The first through electrode structure passes through the base insulating layer, any one or any combination of the light emitting layers, and the interlayer insulating layer, and is connected to the first conductivity-type semiconductor layer of each of the light emitting layers, and the second through electrode structure passes through the base insulating layer, and is connected to any one or any combination of the second conductivity-type semiconductor layer of each of the light emitting layers.

According to an aspect of another example embodiment, a method of manufacturing an LED light source module, includes forming a first light emitting layer, the first light emitting layer including a first conductivity-type semiconductor layer, a second conductivity-type semiconductor layer, and an active layer disposed between the first conductivity-type semiconductor layer and the second conductivity-type semiconductor layer, and forming a first region through the active layer and the second conductive-type semiconductor layer to the first conductivity-type semiconductor layer. The method further includes forming a first electrode on the first conductivity-type semiconductor layer and through the first region, forming a second electrode, a third electrode, and a fourth electrode on the second conductivity-type semiconductor layer, and forming a base insulating layer on the second conductivity-type semiconductor layer, in the first region, and surrounding the first electrode, the second electrode, the third electrode, and the fourth electrode, to form a first light emitting stacked body.

BRIEF DESCRIPTION OF DRAWINGS

The above and other aspects will be more clearly understood from the following detailed description taken in conjunction with the accompanying drawings, in which.

DETAILED DESCRIPTION

Figure 1:
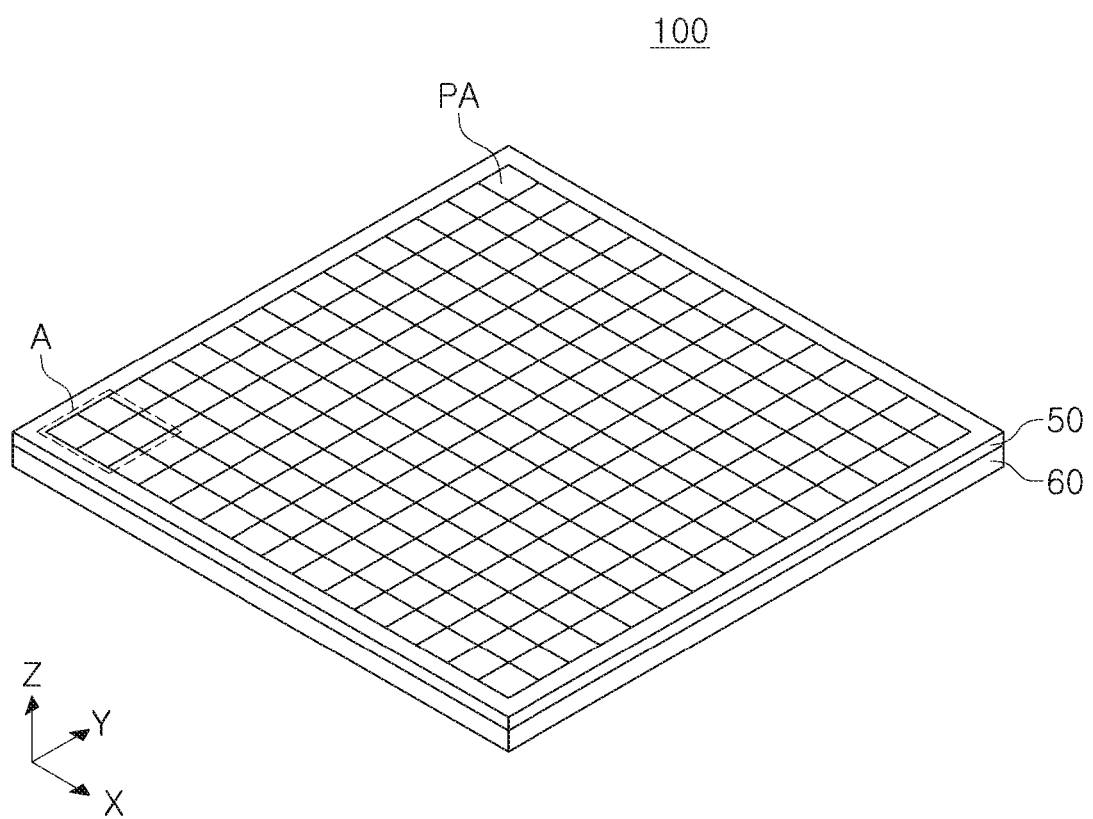
FIG. 1 is a schematic perspective view of a display panel including an LED light source module according to an example embodiment

FIG. 1 is a schematic perspective view of a display panel 100 having an LED light source module according to an example embodiment.

With reference to FIG. 1, the display panel 100 may include a circuit board 60 and an LED light source module 50 arranged on the circuit board 60.

The LED light source module 50 according to an example embodiment may include a plurality of pixels PA selectively emitting red (R) light, green (G) light and blue (B) light. The plurality of pixels PA is consecutively arranged on a panel area. In this example embodiment, a form in which 15×15 pixels are arranged is exemplified for convenience of explanation. In practice, a greater number of pixels (for example, 1,024×768) may be arranged in accordance with a resolution.

In each pixel PA of the LED light source module 50, R, G and B light sources corresponding to a sub-pixel may be provided as a structure in which the light sources are stacked in a thickness direction. A detailed description thereof will be provided with reference to FIGS. 4 to 7.

Figure 8:
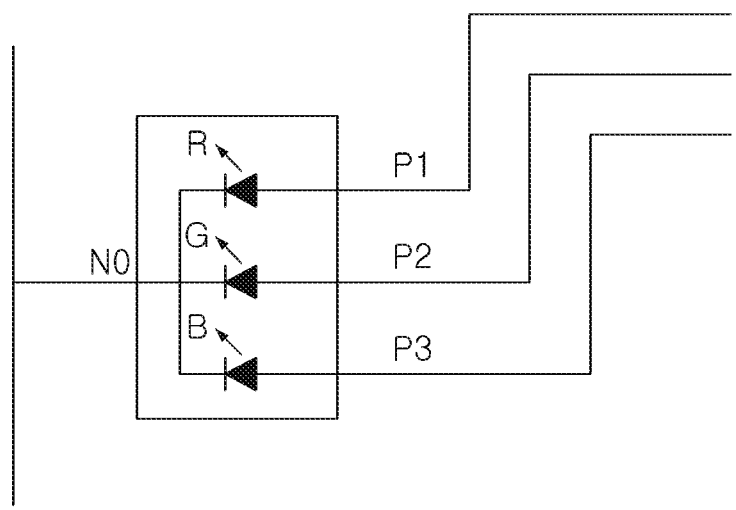
FIG. 8 is a circuit diagram of a pixel area of the LED light source module illustrated in FIG. 1.

The circuit board 60 may include a circuit configured to independently drive sub-pixels R, G, and B of each pixel (referring to FIG. 8). For example, the circuit board 60 may be a TFT substrate including a thin film transistor (TFT).

The display panel 100 may further include a black matrix disposed on the circuit board 60. For example, the black matrix is disposed on a circumference of the circuit board to serve as a guide line defining a mounting area of the LED light source module 50. The black matrix is not limited to being black, and a matrix of other colors such as a white matrix, a green matrix, or the like may be used according to a use and a place of use, or the like, of a product. Moreover, a matrix of a transparent material may be used. The white matrix may further include a light reflective material or a light scattering material. The black matrix may include any one or any combination of materials such as a polymer containing a resin, a ceramic, a semiconductor, or a metal.

Figure 2:
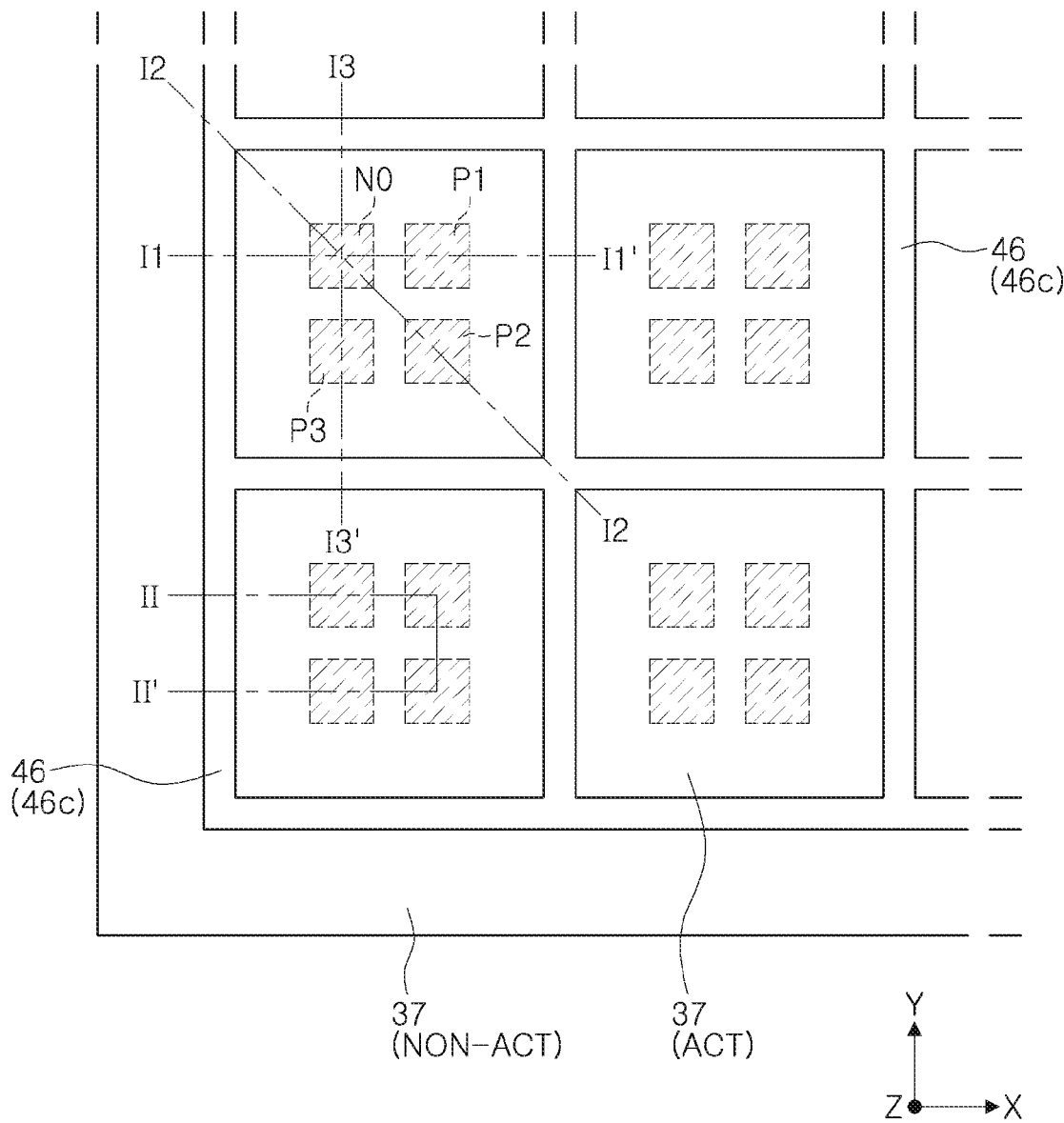
FIGS. 2 and 3 are a bottom view and a rear view respectively, illustrating an enlarged portion of the LED light source module illustrated in FIG. 1.
Figure 3:
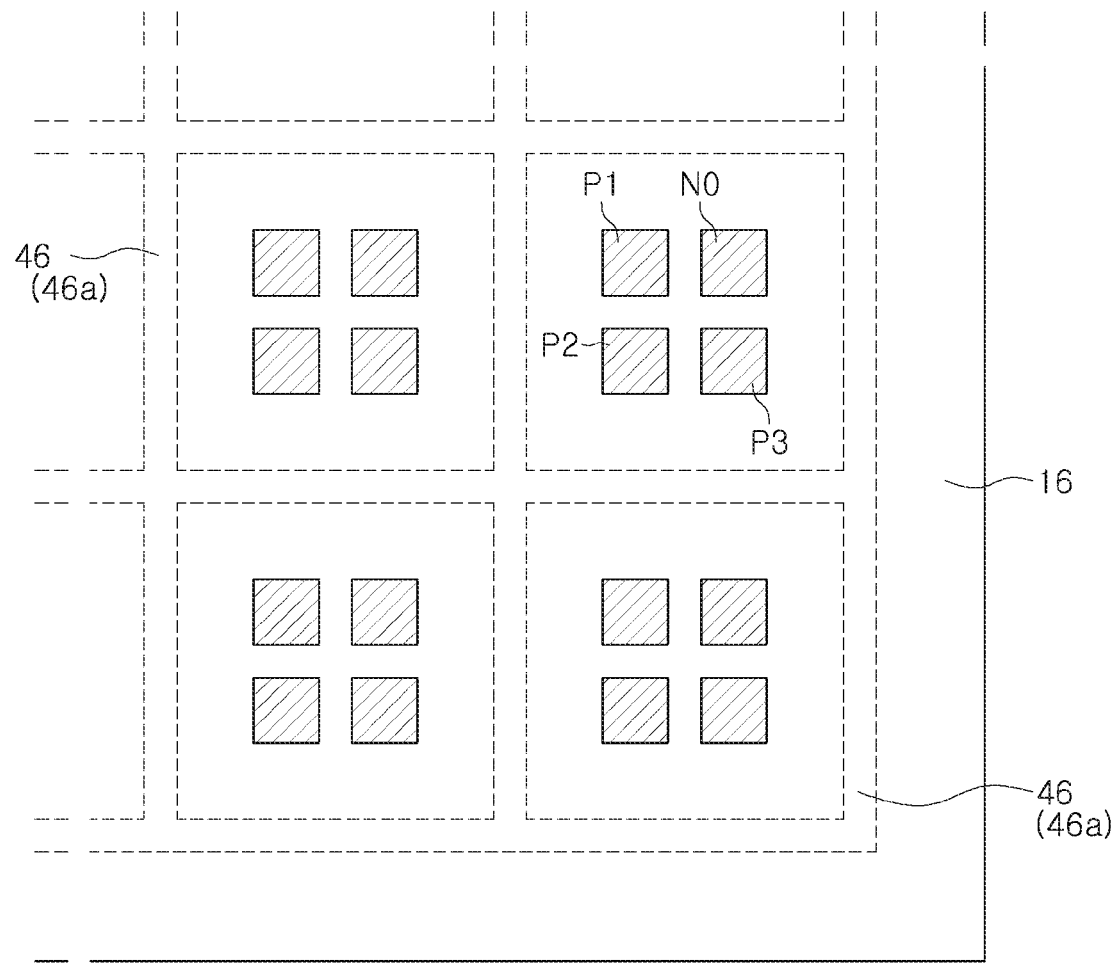

FIGS. 2 and 3 are a bottom view and a rear view, respectively, illustrating an enlarged portion A of the LED light source module 50 illustrated in FIG. 1.

With reference to FIGS. 2 and 3, a plurality of pixels PA may be defined by a partition structure 46. A region surrounded by the partition structure 46 is provided as a light-emitting region ACT as each pixel PA. On the other hand, a region outside of the partition structure may be a non-emitting region NON-ACT. The partition structure 46 may allow each pixel PA to be electrically isolated from others thereof to be driven independently. One common electrode pad N0 and three individual electrode pads P1, P2, and P3 may be provided in a lower surface of the each pixel PA. In an example embodiment, an arrangement of electrode pads N0 and P1 to P3 exemplifies a rectangular arrangement, but is not limited thereto.

Figure 4:
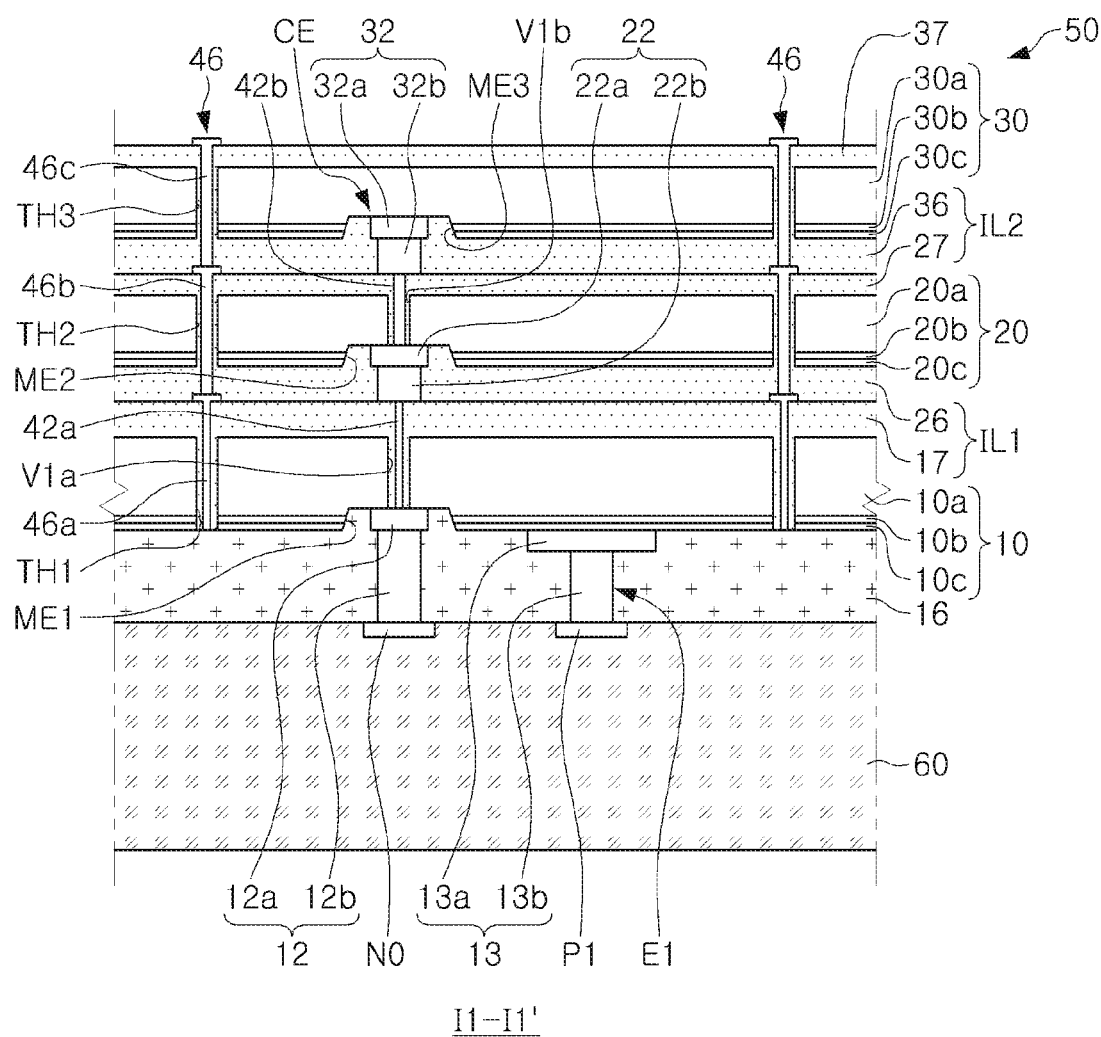
FIG. 4 is a side cross-sectional view taken along line I1-I1' of the LED light source module illustrated in FIG. 2.
Figure 5:
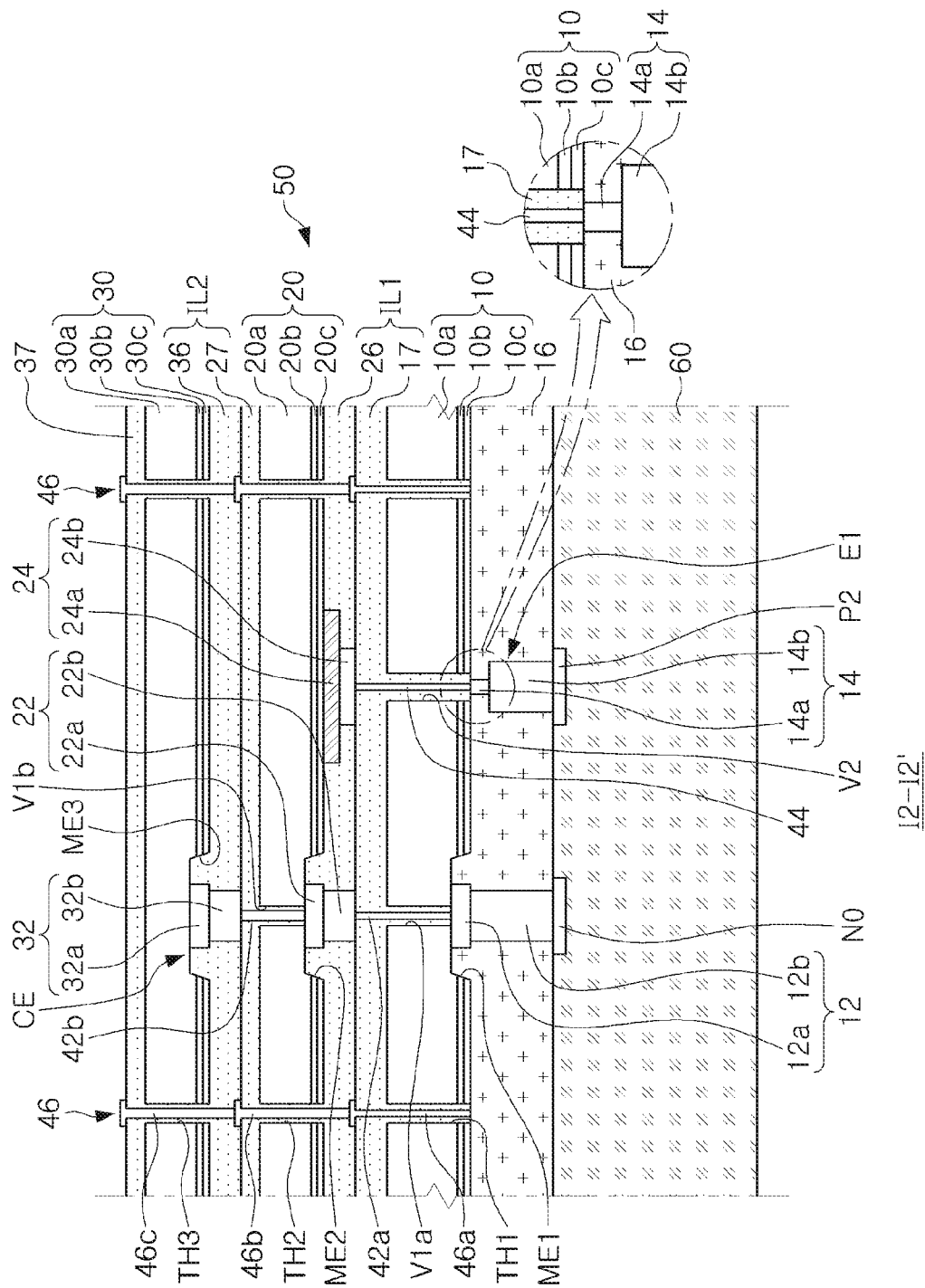
FIG. 5 is a side cross-sectional view taken along line I2-I2' of the LED light source module illustrated in FIG. 2.
Figure 6:
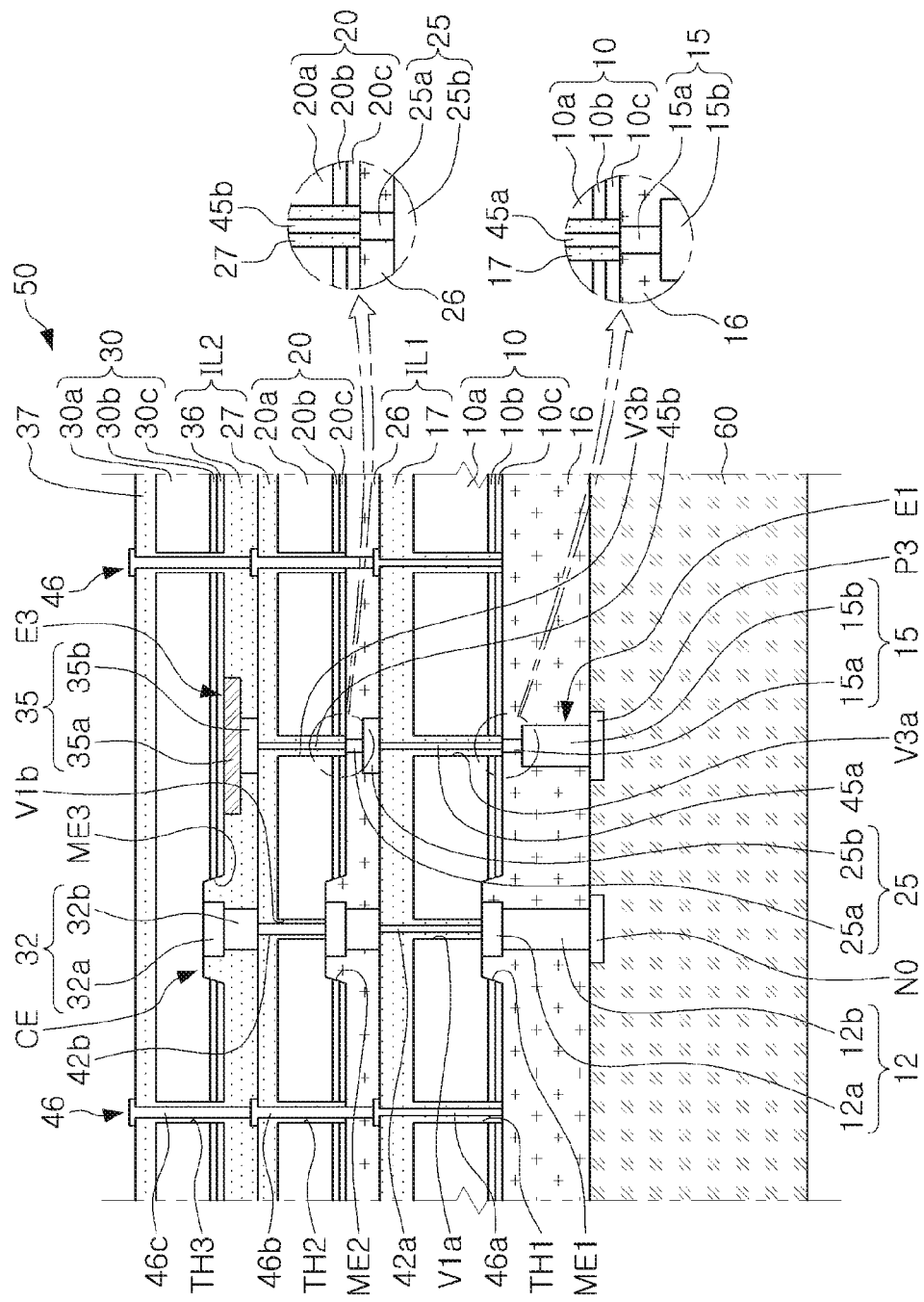
FIG. 6 is a side cross-sectional view taken along line I3-I3' of the LED light source module illustrated in FIG. 2.
Figure 7:
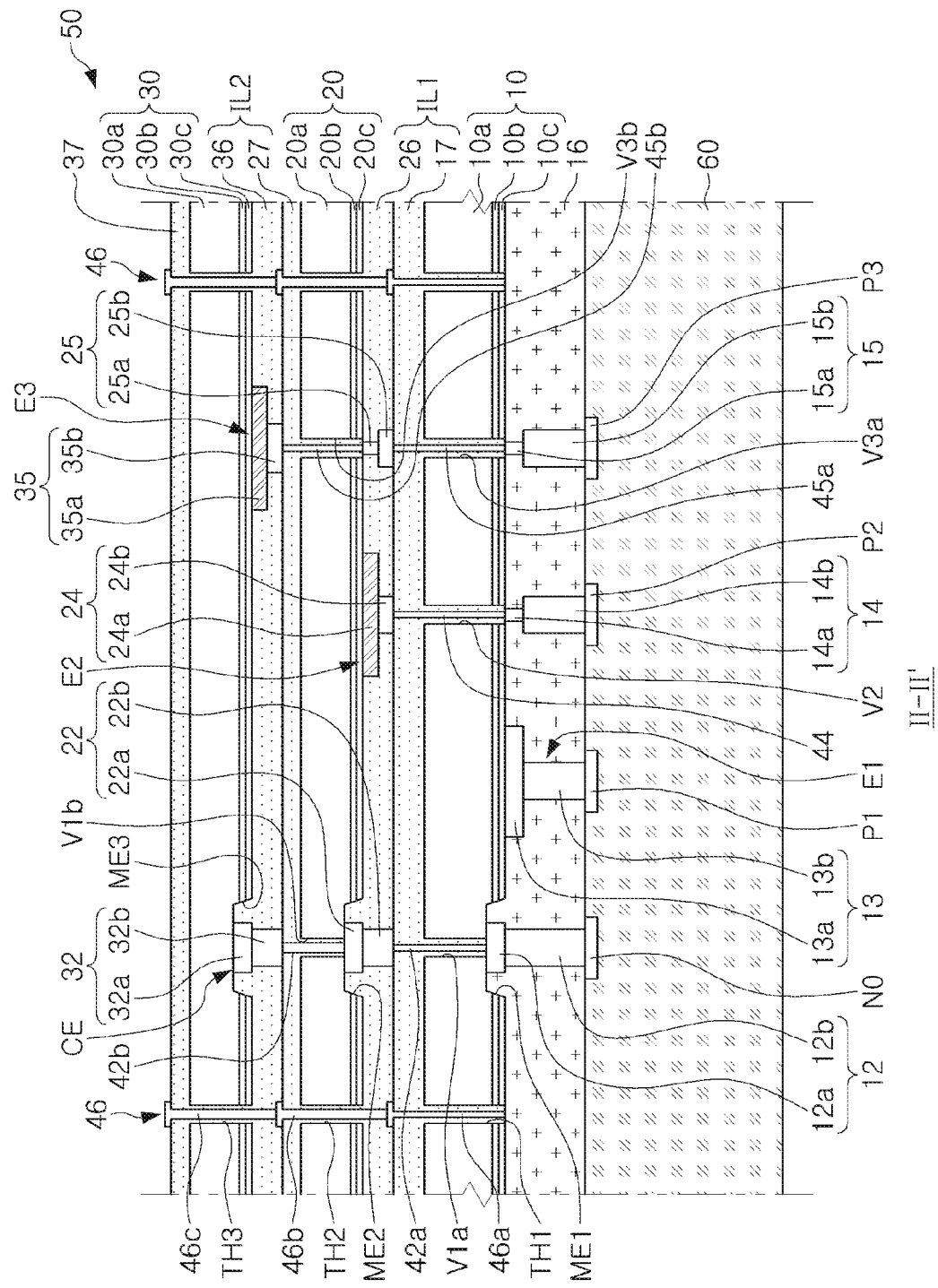
FIG. 7 is a side cross-sectional view taken along line II-II' of the LED light source module illustrated in FIG. 2.

FIG. 4 is a side cross-sectional view taken along line I1-I1' of the LED light source module 50 illustrated in FIG. 2. FIG. 5 is a side cross-sectional view taken along line I2-I2' of the LED light source module 50 illustrated in FIG. 2. FIG. 6 is a side cross-sectional view taken along line I3-I3' of the LED light source module 50 illustrated in FIG. 2. FIG. 7 is a side cross-sectional view taken along line II-II' of the LED light source module 50 illustrated in FIG. 2.

In detail, FIGS. 4 to 6 are side cross-sectional views illustrating an electrode structure for selectively driving sub-pixels (red, green, and blue) in one pixel, and FIG. 7 is a side cross-sectional view taken along line II-II' of the display panel illustrated in FIG. 2 and illustrates all through electrode structures.

With reference to FIGS. 4 to 7, the display panel 100 may include the LED light source module 50 disposed on the circuit board 60.

The LED light source module 50 according to an example embodiment includes a light emitting stacked body including a base insulating layer 16 and first to third semiconductor light emitting units 10, 20, and 30 sequentially stacked on the base insulating layer 16. The light emitting stacked body may include a first interlayer insulating layer IL1 disposed between a first semiconductor light emitting unit and a second semiconductor light emitting unit 20, and a second interlayer insulating layer IL2 disposed between the second semiconductor light emitting unit 20 and the third semiconductor light emitting unit 30.

The first to third semiconductor light emitting units 10, 20, and 30 have first conductivity-type semiconductor layers 10a, 20a, and 30a, second conductivity-type semiconductor layers 10c, 20c, and 30c, and active layers 10b, 20b, and 30b disposed therebetween, respectively.

The first conductivity-type semiconductor layers 10a, 20a, and 30a and the second conductivity-type semiconductor layers 10c, 20c, and 30c may be a p-type semiconductor layer and an n-type semiconductor layer, respectively. For example, the first and second conductivity-type semiconductor layers may be formed using a nitride semiconductor represented by an empirical formula $Al_xIn_yGa_{(1-x-y)}N$ (where $0 \leq x \leq 1$, $0 \leq y \leq 1$, and $0 \leq x+y \leq 1$), but are not limited thereto. For example, a GaAs-based semiconductor or a GaP-based semiconductor may be used. The active layers 10b, 20b, and 30b may have a multiple quantum well (MQW) structure in which a quantum well layer and a quantum barrier layer are alternately stacked. For example, the active layers 10b, 20b, and 30b may be a nitride MQW such as InGaN/GaN, GaN/AlGaN, but are not limited thereto. For example, another semiconductor such as GaAs/AlGaAs, InGaP/GaP, or GaP/AlGaP may be used.

The first to third semiconductor light emitting units 10, 20, and 30 may be configured to emit light having different wavelengths. Conditions of emitted light may be implemented in various ways.

In an example embodiment, the active layers 10b, 20b, and 30b of the first to third semiconductor light emitting units may emit light having colors different from each other. For example, the active layers 10b, 20b, and 30b of the first to third semiconductor light emitting units may emit red, green, and blue light, respectively. In this arrangement, in a process in which a short-wavelength light is extracted, loss of light due to absorption by an active layer for a long-wavelength light may be prevented.

The LED light source module 50 according to an example embodiment may have a through electrode structure for selectively driving the first to third semiconductor light emitting units 10, 20, and 30 corresponding to a sub-pixel. The through electrode structure may be formed in a stacking direction (a direction perpendicular to the circuit board) of the LED light source module.

As illustrated in FIG. 7, the LED light source module 50 has a through electrode structure for each pixel, and may include one common electrode CE and first to third individual electrodes E1, E2, and E3.

The common electrode CE may be connected to the first conductivity-type semiconductor layers 10a, 20a, and 30a of the first to third semiconductor light emitting units 10, 20, and 30 in common, while passing through the base insulating layer 16, the first semiconductor light emitting unit 10, the second semiconductor light emitting unit 20, the first interlayer insulating layer IL', and the second interlayer insulating layer IL2.

As illustrated in FIGS. 4 to 7, the common electrode CE may include a first electrode 12 disposed inside the base insulating layer 16 and connected to a first conductivity-type semiconductor layer 10a of the first semiconductor light emitting unit 10, a first conductive via 42a connected to the first electrode 12 and passing through the first semiconductor light emitting unit 10, a second electrode 22 connected to the first conductive via 42a and connected to the first conductivity-type semiconductor layer 20a of the second semiconductor light emitting unit 20 inside the first interlayer insulating layer IL', a second conductive via 42b connected to the second electrode 22 and passing through the second semiconductor light emitting unit 20, and a third electrode 32 connected to the second conductive via 42b and connected to the first conductivity-type semiconductor layer 30a of the third semiconductor light emitting unit 30 inside the second interlayer insulating layer IL2.

In an example embodiment, the first to third electrodes 12, 22, and 32 may include contact electrodes 12a, 22a, and 32a, and electrode posts 12b, 22b, and 32b disposed on the contact electrodes 12a, 22a, and 32a, respectively. The contact electrodes 12a, 22a, and 32a of the first to third electrodes may be disposed on a mesa-etched region in which the active layers 10b, 20b, and 30b and the second conductivity-type semiconductor layers 10c, 20c, and 30c are partially removed, to be connected to the first conductivity-type semiconductor layers 10a, 20a, and 30a, respectively. The electrode posts 12b, 22b, and 32b may be adopted to obtain a desired electrode height.

The first conductive via 42a may be electrically insulated from the first semiconductor light emitting unit 10 in a path in which the first conductive via passes through the first semiconductor light emitting unit 10. As illustrated in FIGS. 4 to 7, the insulation may be implemented as the first interlayer insulating layer IL1 is extended around the first conductive via 42a along an inner wall of a first hole V1a. In a manner similar thereto, the second interlayer insulating layer IL2 may be extended around the second conductive via 42b to allow the second conductive via 42b along an inner wall of a second hole V1b to be electrically insulated from the second semiconductor light emitting unit 20.

The first to third individual electrodes E1, E2, and E3 may be connected to the second conductivity-type semiconductor layers 10c, 20c, and 30c of the first to third semiconductor light emitting units 10, 20, and 30, respectively.

The first individual electrode E1 may include a fourth electrode 13 passing through the base insulating layer 16 and connected to the second conductivity-type semiconductor layer 10c of the first semiconductor light emitting unit 10. The fourth electrode 13 may include a contact electrode 13a and an electrode post 13b in a manner similar to the first electrode 12 and the second electrode 22.

The second individual electrode E2 passes through the base insulating layer 16, the first semiconductor light emitting unit 10, and the first interlayer insulating layer IL', and may be connected to the second conductivity-type semiconductor layer 20c of the second semiconductor light emitting unit 20.

As illustrated in FIGS. 5 and 7, the second individual electrode E2 may include a fifth electrode 14 disposed inside the base insulating layer 16 and electrically insulated from the first semiconductor light emitting unit 10, a third conductive via 44 connected to the fifth electrode 14 and passing through the first semiconductor light emitting unit 10, and a sixth electrode 24 connected to the third conductive via 44 and connected to the second conductivity-type semiconductor layer 20c of the second semiconductor light emitting unit 20 inside the first interlayer insulating layer IL1.

In an example embodiment, the sixth electrode 24 may include a contact electrode 24a and an electrode post 24b disposed on the contact electrode 24a in a manner similar to the first to third electrodes 12, 22, and 32 described above. On the other hand, the fifth electrode 14 may include a noncontact electrode 14a not connected to the first semiconductor light emitting unit 10 and an electrode post 14b. The noncontact electrode 14a may be formed smaller than a third hole V2 in a manner the same as an example embodiment. Alternatively, the noncontact electrode 14a may be formed in such a manner that an additional insulating layer is provided (referring to FIG. 31). The first interlayer insulating layer IL1 may be extended around the third conductive via 44 along an inner wall of the third hole V2 to allow the third conductive via 44 to be electrically insulated from the first semiconductor light emitting unit 10.

The third individual electrode E3 passes through the base insulating layer 16, the first semiconductor light emitting unit 10, the second semiconductor light emitting unit 20, the first interlayer insulating layer IL1, and the second interlayer insulating layer IL2, and connected to the second conductivity-type semiconductor layer 30c of the third semiconductor light emitting unit 30.

As illustrated in FIGS. 6 and 7, the third individual electrode E3 includes a seventh electrode 15 disposed inside the base insulating layer 16 and electrically insulated from the first semiconductor light emitting unit 10, a fourth conductive via 45a connected to the seventh electrode 15 and passing through the first semiconductor light emitting unit 10, an eighth electrode 25 connected to the fourth conductive via 45a and electrically insulated from the second semiconductor light emitting unit 20 inside the first interlayer insulating layer IL1, a fifth conductive via 45b connected to the eighth electrode 25 and passing through the second semiconductor light emitting unit 20, and a ninth electrode 35 connected to the fifth conductive via 45b and electrically connected to the second conductivity-type semiconductor layer 30c of the third semiconductor light emitting unit 30 inside the second interlayer insulating layer IL2.

In an example embodiment, the ninth electrode 35 may include a contact electrode 35a and an electrode post 35b in a manner similar to the first to third electrodes 12, 22, and 32 described above. On the other hand, the seventh electrode 15 and the eighth electrode 25 may include noncontact electrodes 15a and 25a not connected to the first semiconductor light emitting unit 10 and the second semiconductor light emitting unit 20, and electrode posts 15b and 25b, respectively. The noncontact electrodes 15a and 25a may be formed to be smaller than an area of holes V3a and V3b or as an additional insulating layer is adopted as described in an example embodiment.

The first interlayer insulating layer IL1 may be extended around the fourth conductive via 45a along an inner wall of a fourth hole V3a to allow the fourth conductive via 45a to be electrically insulated from the first semiconductor light emitting unit 10. In a manner similar thereto, the fifth conductive via 45b may be electrically insulated from the second semiconductor light emitting unit 20 by the second interlayer insulating layer IL2 extended along an inner wall of a fifth hole V3b.

In an example embodiment, the first interlayer insulating layer IL1 and the second interlayer insulating layer IL2 may be configured of pairs of insulating layers 17 and 26, and 27 and 36, provided on opposing surfaces of two semiconductor light emitting units adjacent to each other, respectively. As illustrated in FIGS. 4 to 7, the first interlayer insulating layer IL1 includes a first insulating layer 17 provided on an upper surface (a surface to which electrodes are not connected) of the first semiconductor light emitting unit 10, and a second insulating layer 26 provided on a lower surface (a surface to which electrodes are connected) of the second semiconductor light emitting unit 20. In a manner similar thereto, the second interlayer insulating layer IL2 includes a third insulating layer 27 provided on an upper surface of the second semiconductor light emitting unit 20, and a fourth insulating layer 36 provided on a lower surface of the third semiconductor light emitting unit 30. Here, the first to fourth insulating layers 17, 26, 27, and 36 may be provided as a bonding surface for each of the semiconductor light emitting units 10, 20, and 30. In addition, the second insulating layer 26 and the fourth insulating layer 36 serve to protect contact electrodes of the second semiconductor light emitting unit 20 and the third semiconductor light emitting unit 30. It will be described in detail in FIGS. 16 to 30.

The LED light source module 50 according to an example embodiment may further include an outer insulating layer 37 disposed on the third semiconductor light emitting unit 30. The outer insulating layer 37 may be formed in a manner similar to the first insulating layer 17 and the third insulating layer 27. The base insulating layer 16 may include a light-absorbing or reflective material. The base insulating layer may be formed using a material such as the black matrix described previously. Alternatively, the base insulating layer 16 may be formed using an insulating resin containing light-reflective particles. For example, the insulating resin may be formed using epoxy, silicon, polyacrylate, polyimide, polyamide, and benzocyclobutene (BCB), but is not limited thereto. The light-reflective particles may be formed using titanium dioxide ($TiO_2$) or aluminum oxide ($Al_2O_3$).

As illustrated in FIG. 7, the LED light source module 50 according to an example embodiment includes the partition structure 46 passing through the first to third semiconductor light emitting units 10, 20, and 30, the first interlayer insulating layer IL1, and the second interlayer insulating layer IL2. As illustrated in FIGS. 2 and 3, the partition structure 46 allows a pixel area to be defined and to be divided into the plurality of pixels PA.

With regard to the partition structure 46, the base insulating layer 16 not allowing light to be transmitted (for example, reflexibility) is disposed in a lower portion of the partition structure, optical interference between pixels PA may be effectively prevented by the partition structure 46.

The partition structure 46 employed in an example embodiment may include first to third partitions 46a, 46b, and 46c passing through the first to third semiconductor light emitting units, respectively. The first to third partitions 46a, 46b, and 46c may be integrally connected to each other. The first to third partitions 46a, 46b, and 46c may be formed using a metallic material the same as conductive vias employed in an example embodiment.

In an example embodiment, surfaces of the common electrode CE and the first to third individual electrodes E1, E2, and E3 may be connected to the common electrode pad N0, and the first to third individual electrode pads P1 to P3 disposed on lower surfaces of the base insulating layer 16a, respectively. The common electrode pad N0 and the first to third individual electrode pads P1 to P3 are connected to a circuit inside the circuit board 60, and the circuit inside the circuit board 60 may be configured to selectively drive a sub-pixel (a semiconductor light emitting unit) of each pixel PA.

For example, when a voltage is applied to the common electrode pad N0 and the first individual electrode pad P1, as illustrated in FIG. 4, the corresponding pixel may emit red light. When a voltage is applied to the common electrode pad N0 and the second individual electrode pad P2, as illustrated in FIG. 5, the corresponding pixel may emit green light. In addition, when a voltage is applied to the common electrode pad N0 and the third individual electrode pad P3, as illustrated in FIG. 6, the corresponding pixel may emit blue light.

As described above, each of the semiconductor light emitting units 10, 20, and 30 forming sub-pixels R, G, and B may have various circuit connection configurations to be independently operated.

FIG. 8 is a circuit diagram of the pixel area PA of the LED light source module 50 illustrated in FIG. 1. Here, "R," "G," and "B" denote sub-pixels in a pixel PA illustrated in FIG.

1, and may be understood as the first to third semiconductor light emitting units 10, 20, and 30, respectively.

As illustrated in FIG. 8, a cathode (N0, a common electrode pad) of the semiconductor light emitting units 10, 20, and 30 may be connected to a cathode of semiconductor light emitting units 10, 20, and 30 of another pixel disposed in the same row, and anodes P1, P2, and P3 of the semiconductor light emitting units 10, 20, and 30 may be connected to a constant current input terminal of an LED driving circuit for each color in the same column. As power is supplied to a cathode of an LED in a row through a control unit and power is applied to anodes P1, P2, and P3 having a desired color by controlling the LED driving circuit, a semiconductor light emitting unit of a desired sub-pixel in a pixel may emit light.

As described above, as semiconductor light emitting units 10, 20, and 30 having a desired color are selectively driven in each pixel PA, a desired color image may be provided in an entire display panel. In addition, a pixel area and an arrangement of a vertical electrode structure are appropriately adjusted by the partition structure 46 to variously adjust an area of a pixel.

FIGS. 9, 10, 11, 12, and 13 are cross-sectional views illustrating a process of forming a first semiconductor stacked body employable in the LED light source module 50 illustrated in FIG. 1. This flow chart may be understood to illustrate a cross section taken along line II-II' of one pixel illustrated in FIG. 2.

Figure 9:
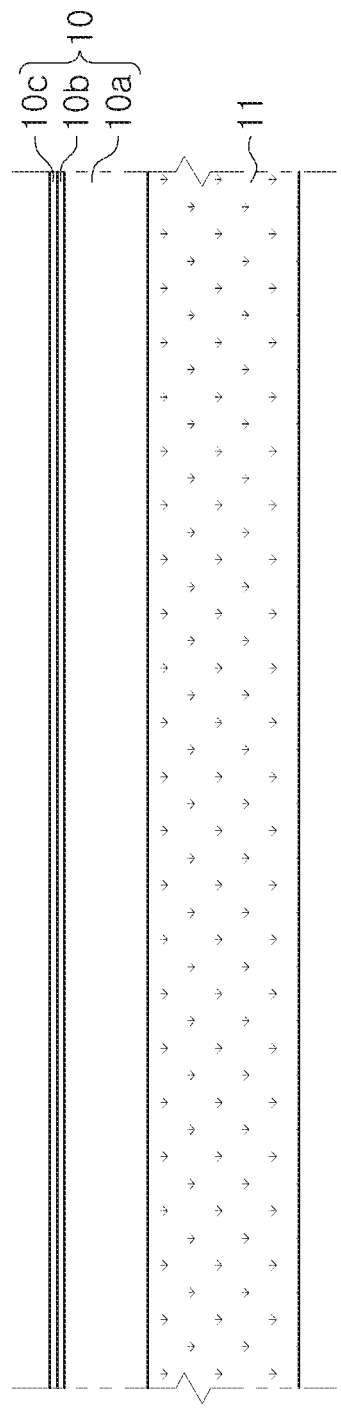
FIGS. 9, 10, 11, 12, and 13 are cross-sectional views of a process of forming a first semiconductor stacked body employable in the LED light source module illustrated in FIG. 1.

As illustrated in FIG. 9, the first semiconductor light emitting unit 10 may be formed on a growth substrate 11.

The first semiconductor light emitting unit 10 may include the first conductivity-type semiconductor layer 10a, the active layer 10b, and the second conductivity-type semiconductor layer 10c. In an example embodiment, the active layer 10b may be configured to emit red light. For example, the active layer may emit light having a wavelength of 610 nm to 640 nm.

Each layer of the first semiconductor light emitting unit 10 may be formed using a nitride semiconductor, but is not limited thereto. The each layer thereof may grow on the growth substrate 11 using a process such as a metal-organic chemical vapour deposition (MOCVD), molecular beam epitaxy (MBE), a hydride vapor phase epitaxy (HVPE) deposition, or the like.

The first conductivity-type semiconductor layer 10a may be formed using a nitride semiconductor represented by an empirical formula n-type $Al_xIn_yGa_{1-x-y}N$ (where $0 \leq x \leq 1$, $0 \leq y \leq 1$, and $0 \leq x+y \leq 1$), and an n-type impurity may be Si. For example, the first conductivity-type semiconductor layer 10a may be formed using n-type GaN. The second conductivity-type semiconductor layer 10c may be a nitride semiconductor layer represented by an empirical formula p-type $Al_xIn_yGa_{1-x-y}N$, and a p-type impurity may be magnesium (Mg). For example, the second conductivity-type semiconductor layer 10c may be formed using p-type AlGaN/GaN. The active layer 10b may have a multiple quantum well (MQW) structure in which a quantum well layer and a quantum barrier layer are alternately stacked. For example, when a nitride semiconductor is used, the active layer 10b may have a GaN/InGaN MQW structure.

A buffer layer may be formed on the growth substrate 11 in advance. The buffer layer may be formed using a nitride semiconductor represented by an empirical formula $Al_xIn_yGa_{1-x-y}N$ ($0 \leq x \leq 1$, and $0 \leq y \leq 1$). For example, the buffer layer may be formed using AlN, AlGaN, or InGaN.

Figure 10:
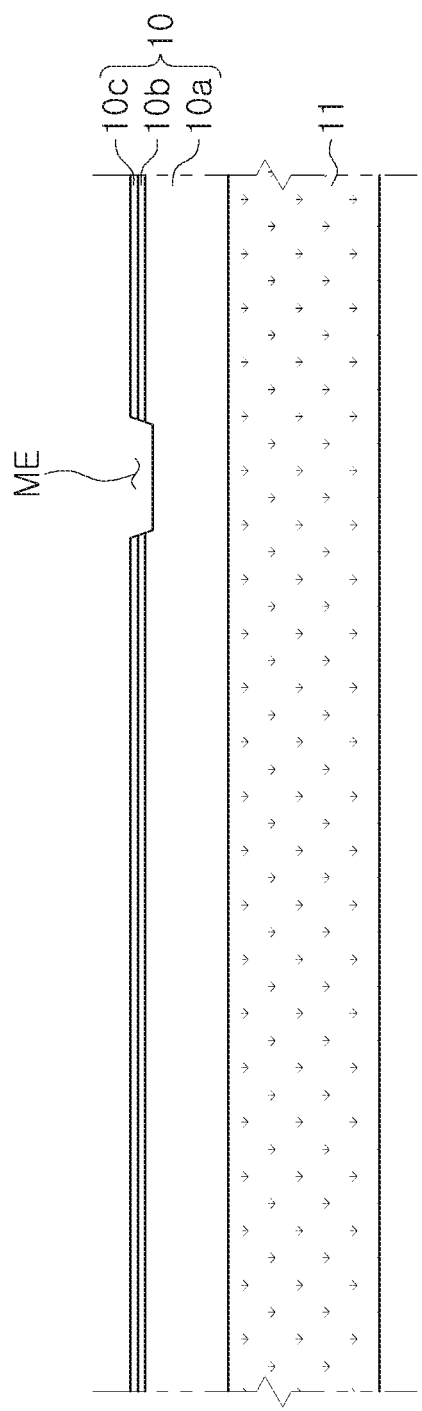

Next, as illustrated in FIG. 10, the first semiconductor light emitting unit 10 may be mesa-etched to allow the first conductivity-type semiconductor layer 10a to be partially exposed.

This etching process may be performed by partially removing the second conductivity-type semiconductor layer 10c and the active layer 10b. An exposed portion, a mesa-etched region ME1, of the first conductivity-type semiconductor layer 10a allows an electrode to be formed.

Figure 11:
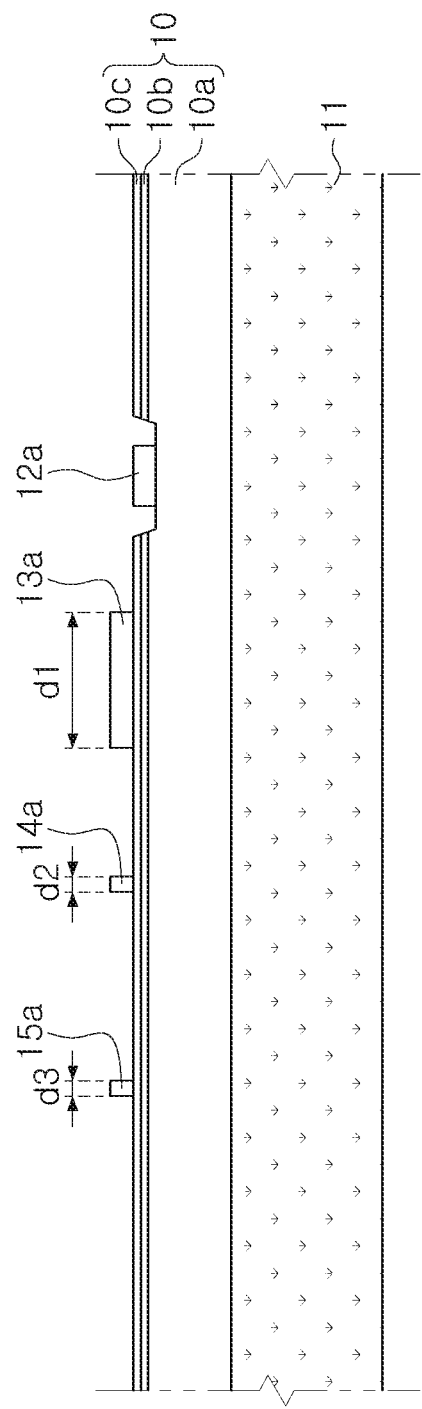

Next, as illustrated in FIG. 11, electrode layers 12a, 13a, 14a, and 15a may be formed in the exposed region, the mesa-etched region ME1, of the first conductivity-type semiconductor layer 10a and portions of the second conductivity-type semiconductor layer 10c. The electrode layers 13a, 14a, and 15a may have lengths of distances d1, d2, and d3, respectively.

Positions on which the electrode layers 12a, 13a, 14a, and 15a are formed may be correspond to positions of the common electrode CE and the first to third individual electrodes E1, E2, and E3 described in an example embodiment described previously. The electrode layers 12a, 13a, 14a, and 15a may include a material such as silver (Ag), nickel (Ni), aluminum (Al), rhodium (Rh), palladium (Pd), iridium (Ir), ruthenium (Ru), Mg, zinc (Zn), platinum (Pt), gold (Au), or the like, respectively, and may have a single layer structure or a multilayer structure. The electrode layers 12a, 13a, 14a, and 15a may be formed by a single electrode forming process, but are not limited thereto. In this case, the electrode layers may be formed using the same electrode material.

A portion of the electrode layers, in other words, electrode layers 12a and 13a related to the common electrode CE and the first individual electrode E1 may be used as a contact electrode. The contact electrodes 12a and 13a may be formed to have a sufficient size to be connected to the first conductivity-type semiconductor layer 10a and the second conductivity-type semiconductor layer 10c, respectively, after a subsequent process (for example, via formation). Another portion thereof, in other words, electrode layers 14a and 15a related to the second individual electrode E2 and the third individual electrode E3, may be used as a noncontact electrode. As the noncontact electrodes 14a and 15a are formed to have a small size, the noncontact electrodes may not be electrically connected to the first semiconductor light emitting unit 10 in a subsequent processes (for example, via formation).

Figure 12:
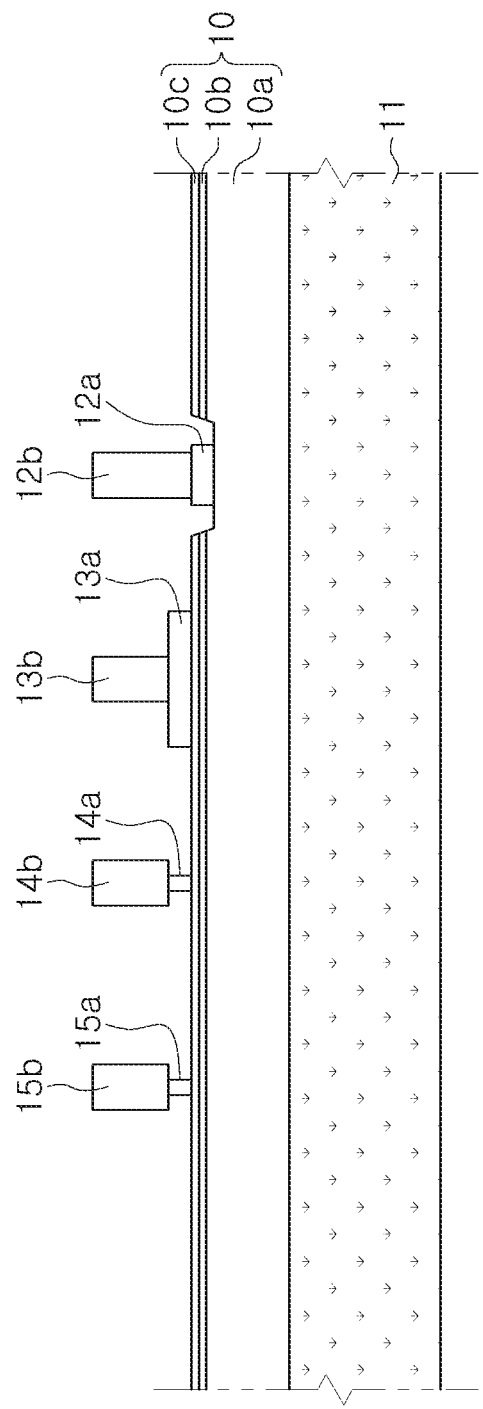

Next, as illustrated in FIG. 12, electrode posts 12b, 13b, 14b, and 15b are formed on the contact electrodes 12a and 13a and the noncontact electrodes 14a and 15a, respectively. The electrode posts 12b, 13b, 14b, and 15b may be formed to have a constant height. After the post forming process followed by a base insulating layer forming process (referring to FIG. 13), the electrode may be exposed externally. The electrode posts 12b, 13b, 14b, and 15b may be formed of a metal such as Au, copper (Cu), Ag, and Al or alloys thereof.

Figure 13:
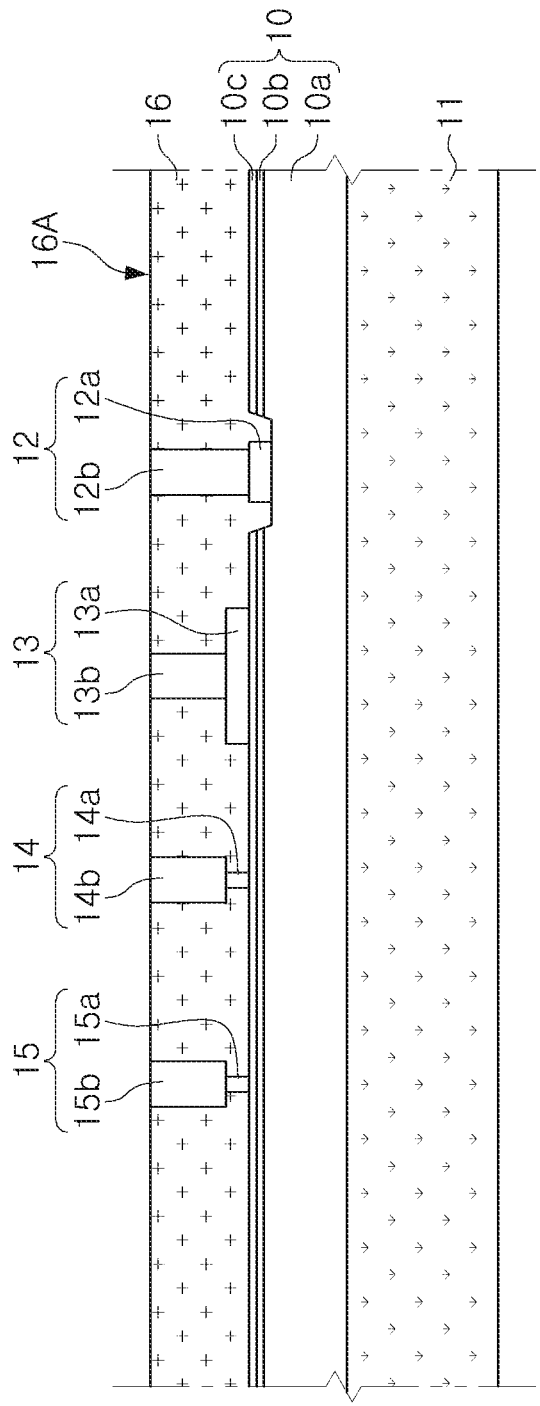

Next, as illustrated in FIG. 13, the base insulating layer 16 may be formed to allow electrodes 12, 13, 14, and 15 to be exposed.

In this process of forming of the base insulating layer, after an insulating material is formed to have a sufficient thickness to allow the electrodes 12, 13, 14, and 15 to be covered therewith, surfaces of the electrodes 12, 13, 14, and 15 may be exposed through a grinding process. In addition, through the grinding process, a surface 16A of the base insulating layer 16 may be provided as a flat surface for bonding. The base insulating layer 16 may be formed using various insulating materials.

In an example embodiment, the base insulating layer may be formed using an insulating material not allowing light to be transmitted, in other words, a light-absorbing insulating material or a reflective insulating material. For example, the base insulating layer 16 may be formed using a material related to the black matrix described previously, or an insulating resin mixed with light-reflective powder. The insulating resin may be formed using epoxy, silicon, polyacrylate, polyimide, polyamide, and benzocyclobutene (BCB). The light-reflective particles may be formed using titanium dioxide ($TiO_2$) or aluminum oxide ($Al_2O_3$).

The second semiconductor light emitting unit and the third semiconductor light emitting unit, used for a process of manufacturing a display panel or a light source module according to an example embodiment, may be prepared by a process similar to a foregoing process.

Figure 14:
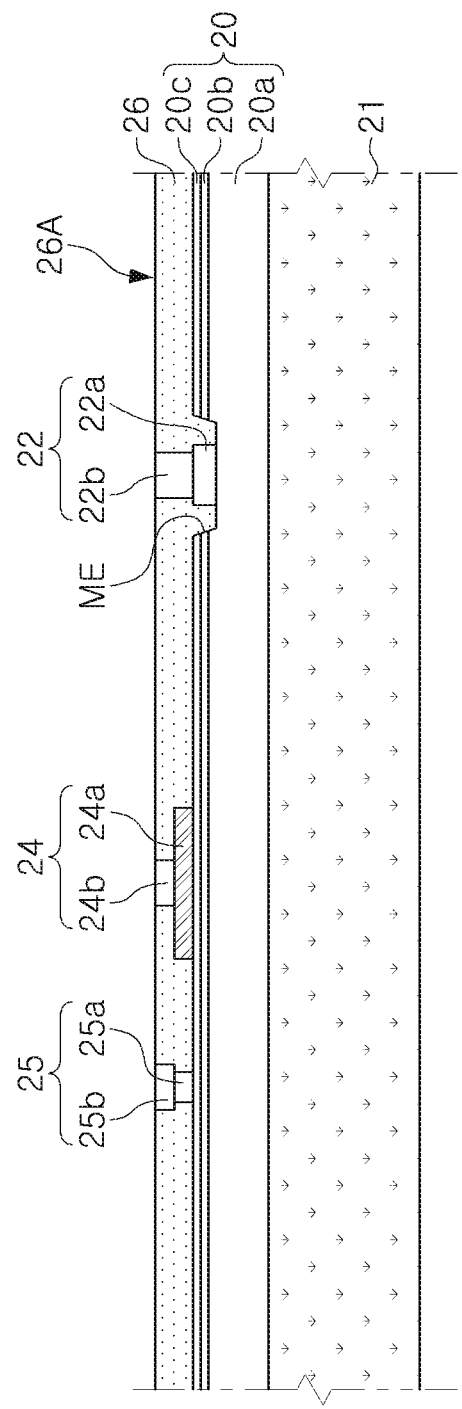
FIGS. 14 and 15 are side cross-sectional views of a second semiconductor stacked body and a third semiconductor stacked body, respectively, employable in the LED light source module illustrated in FIG. 1.
Figure 15:
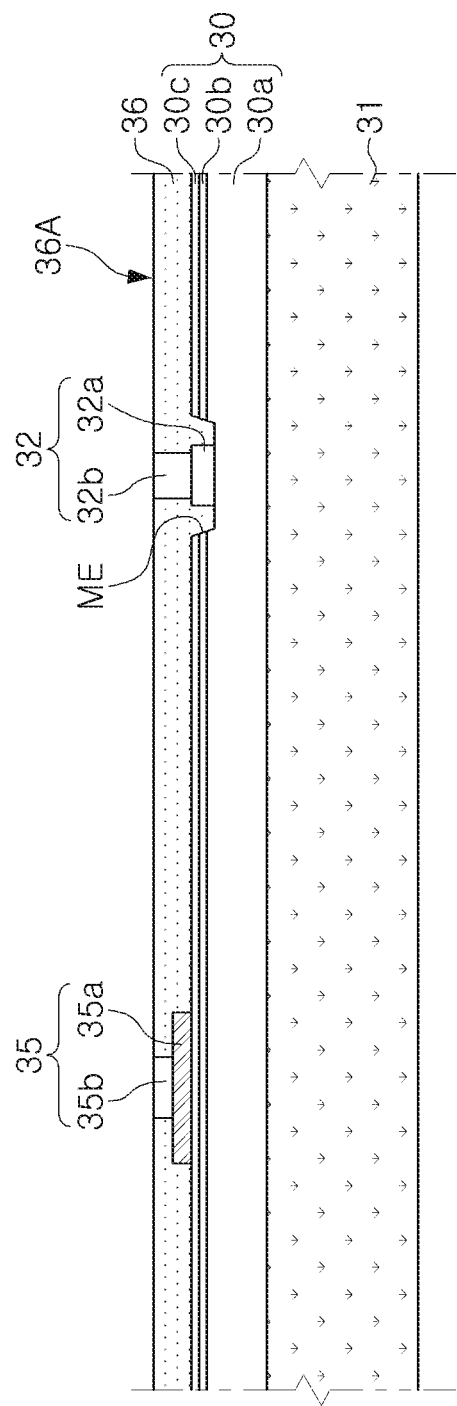

FIGS. 14 and 15 are side cross-sectional views of a second semiconductor stacked body and a third semiconductor stacked body, respectively, employable in the LED light source module 50 illustrated in FIG. 1.

With reference to FIG. 14, a second semiconductor light emitting unit 20 may be disposed on the growth substrate 21. The second semiconductor light emitting unit 20 may include an active layer 20b emitting green light. For example, the active layer 20b may have a peak wavelength of 510 nm to 550 nm. One electrode 22 may be disposed on a first conductivity-type semiconductor layer 20a exposed to a mesa-etched region ME2, and two electrodes 24 and 25 may be disposed on the second conductivity-type semiconductor layer 20c. A second insulating layer 26 having a flat upper surface 26A to allow the electrodes 22, 24, and 25 to be exposed may be provided. The second insulating layer 26 may be formed using a light-transmissive insulating material. For example, the second insulating layer 26 may be formed using epoxy, silicon, polyacrylate, polyimide, polyamide, and benzocyclobutene (BCB).

The electrodes 22, 24, and 25 may be disposed in regions corresponding to the common electrode CE, the second individual electrode P2, and the third individual electrode P3, respectively. The electrodes 22 and 24 may include contact electrodes 22a and 24a and electrode posts 22b and 24b, respectively. Here, the contact electrodes 22a and 24a may be a transparent electrode formed of a material such as an indium tin oxide (ITO). Thus, even when the contact electrodes 22a and 24a are formed to have a sufficient area, significant optical loss may be prevented. The electrode 25 may include a noncontact electrode 25a and an electrode post 25b.

With reference to FIG. 15, a third semiconductor light emitting unit 30 may be disposed on a growth substrate 31. The third semiconductor light emitting unit 30 may include the active layer 30b emitting blue light. For example, the active layer 30b may have a peak wavelength of 440 nm to 460 nm. One electrode 32 may be disposed on a first conductivity-type semiconductor layer 30a exposed to a mesa-etched region ME3, and one electrode 35 may be disposed on a second conductivity-type semiconductor layer 30c. A third insulating layer 36 having a flat upper surface 36A to allow the electrodes 32 and 35 to be exposed may be formed. The third insulating layer 36 may be formed using a light-transmissive insulating material. For example, the third insulating layer 36 may be formed using epoxy, silicon, polyacrylate, polyimide, polyamide, and benzocyclobutene (BCB).

The electrodes 32 and 35 may be disposed in regions corresponding to the common electrode CE and the third individual electrode P3, respectively. The electrodes 32 and 35 may include contact electrodes 32a and 35a, and electrode posts 32b and 35b, respectively. Here, the contact electrode 32a disposed on the second conductivity-type semiconductor layer 30c may be formed using a transparent electrode formed of a material such as ITO.

FIGS. 16, 17, 18, 19, 20, 21, 22, 23, 24, 25, 26, 27, 28, 29, and 30 are cross-sectional views of a method of manufacturing the LED light source module 50 illustrated in FIG. 1. This flow chart exemplifies the method of manufacturing a display panel (or a light source module) using a semiconductor light emitting unit illustrated in FIGS. 13 to 16.

Figure 16:
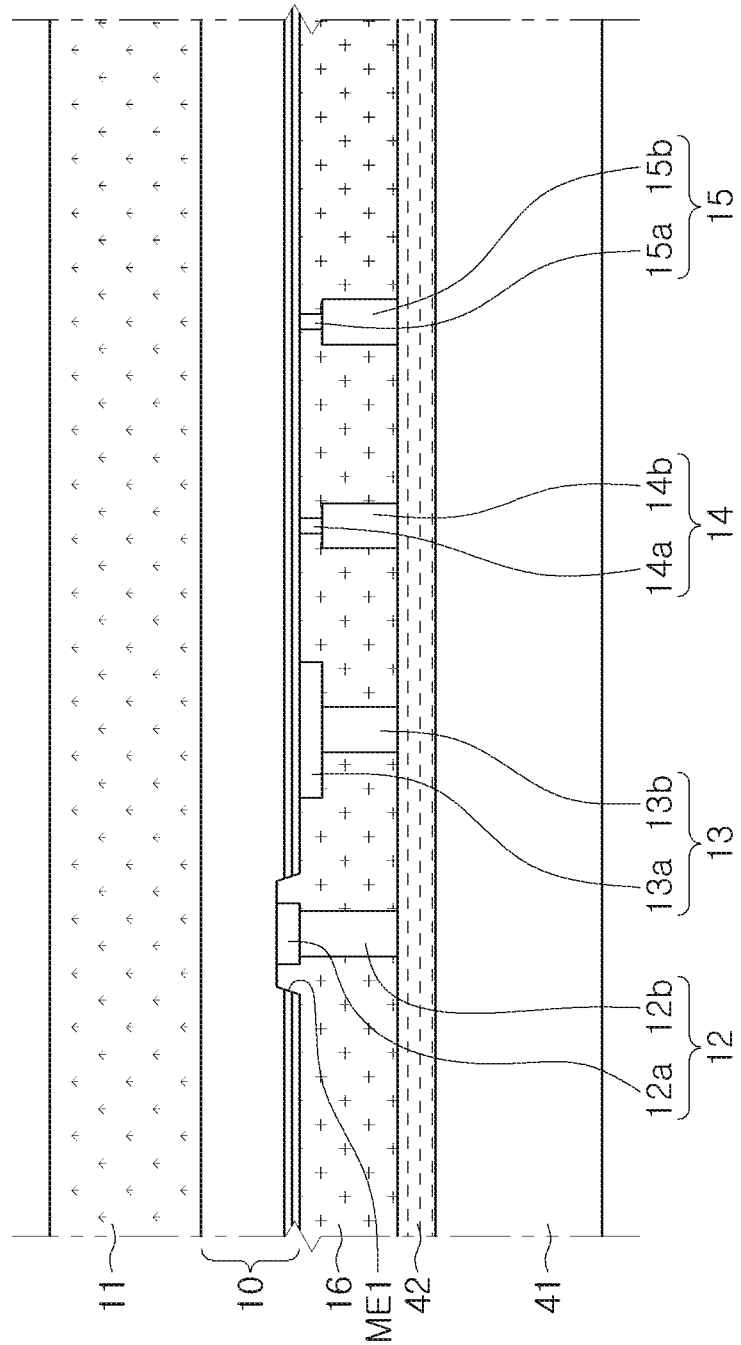
FIGS. 16, 17, 18, 19, 20, 21, 22, 23, 24, 25, 26, 27, 28, 29, and 30 are cross-sectional views of a method of manufacturing the LED light source module illustrated in FIG. 1.

As illustrated in FIG. 16, the first semiconductor light emitting unit 10 illustrated in FIG. 13 may be temporarily bonded to a support substrate 41 using a bonding layer 42.

This bonding process may be performed to allow a surface 16A of the base insulating layer 16 in which the electrodes 12, 13, 14, and 15 are exposed to oppose the support substrate 41.

Figure 17:
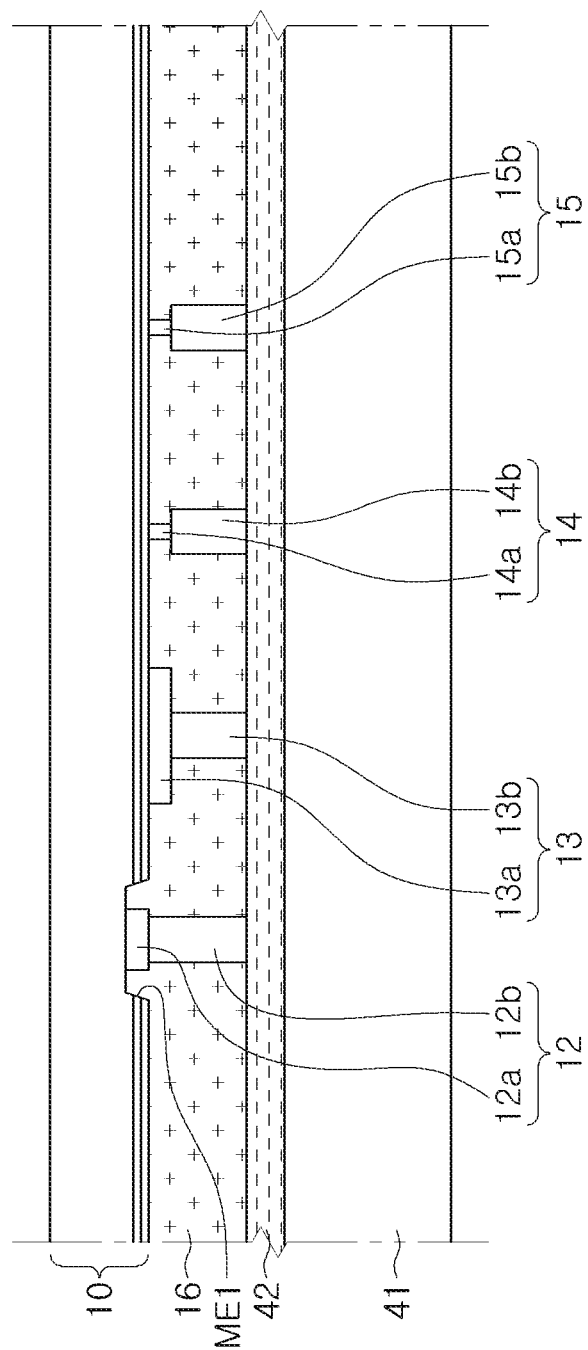

Next, as illustrated in FIG. 17, the growth substrate 11 may be removed from the first semiconductor light emitting unit 10.

This substrate removal process may be performed using a laser lift-off and/or mechanical/chemical polishing process. An additional grinding process may be applied to a surface of the first semiconductor light emitting unit 10 from which the growth substrate 11 is removed.

Figure 18:
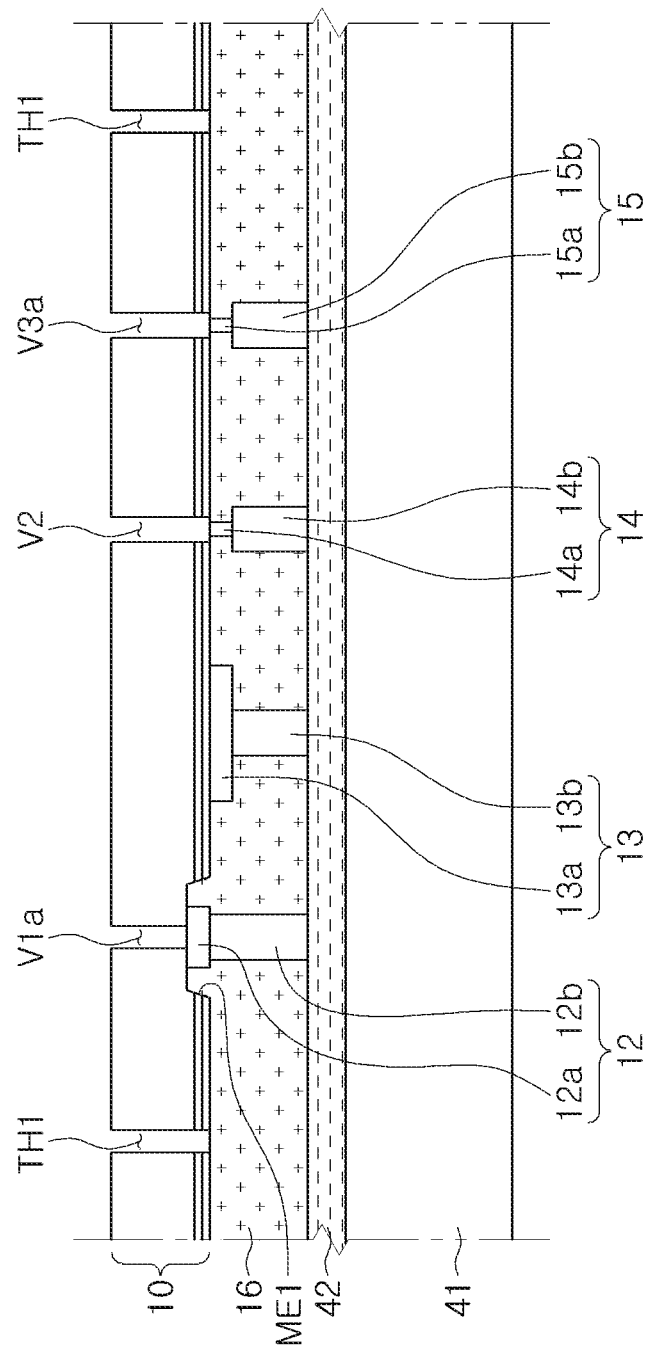

Next, as illustrated in FIG. 18, holes V1a, V2, V3a, and TH1 for formation of an electrode structure and a partition structure may be formed in the first semiconductor light emitting unit 10.

The holes V1a, V2, and V3a for the electrode structure may be provided as a vertical path for a connection of the electrodes 12, 14, and 15 of the first semiconductor light emitting unit 10 with the second semiconductor light emitting unit 20 to form the common electrode CE, the second individual electrode E2, and the third individual electrode E3. The hole TH1 for the formation of the partition structure may be formed to define the pixel PA as illustrated in FIGS. 2 and 3. In other words, the hole TH1 for formation of the partition structure may determine a size and a shape of the pixel PA, and further, an arrangement of a plurality of pixels.

Figure 19:
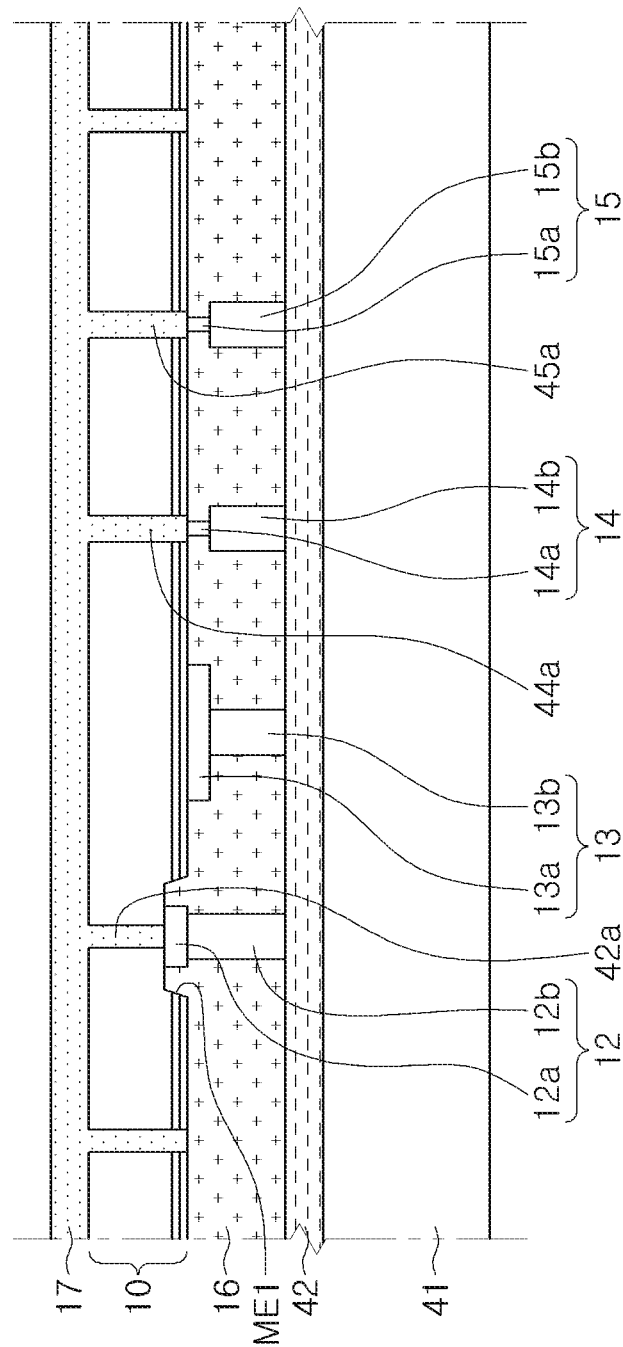

Next, as illustrated in FIG. 19, the first insulating layer 17 is formed on the first semiconductor light emitting unit 10 to allow the holes V1a, V2, V3a, and TH1 to be filled therewith.

After the first insulating layer 17 is formed thereon, a surface of the first insulating layer may be leveled through an additional polishing process. The first insulating layer 17 may be formed using a light-transmissive insulating material. For example, the first insulating layer may be formed using not only a light-transmissive insulating resin described previously, but also $SiO_2$, $Si_3N_4$, $HfO_2$, SiON, $TiO_2$, $Ta_2O_3$, or $SnO_2$.

The first insulating layer 17 may be provided as a surface to be bonded to the second semiconductor light emitting unit 20. In addition, the first insulating layer may serve to prevent an undesired connection of the first insulating layer with a conductive via disposed inside the holes V1a, V2, and V3a to be formed in a subsequent process.

Figure 20:
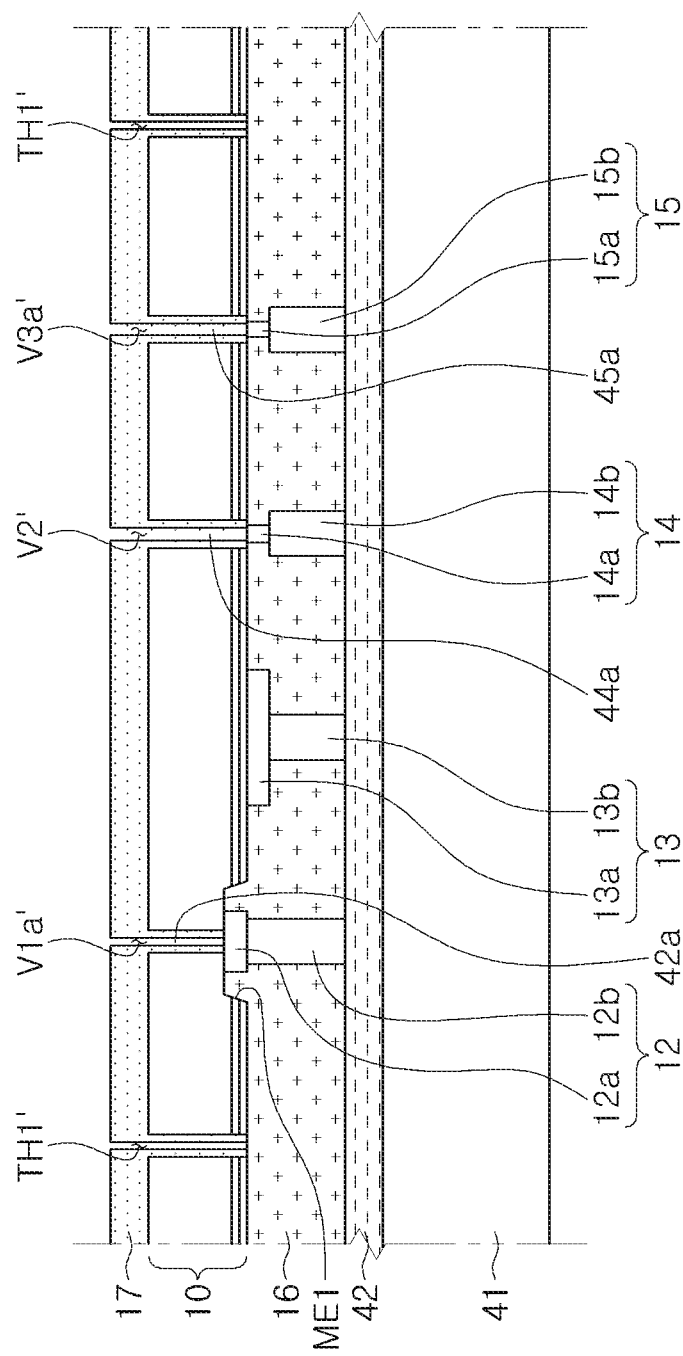

Next, as illustrated in FIG. 20, a material with which the holes V1a, V2, V3a, and TH1 are filled, is partially removed to prepare secondary holes V1a', V2', V3a', and TH1'.

The secondary holes V1a', V2', V3a', and TH1' may prevent an undesired connection of the first semiconductor light emitting unit 10 with a conductive via or a partition to be formed in a subsequent process as a material of the first insulating layer 17 remains in an inner wall thereof.

Figure 21:
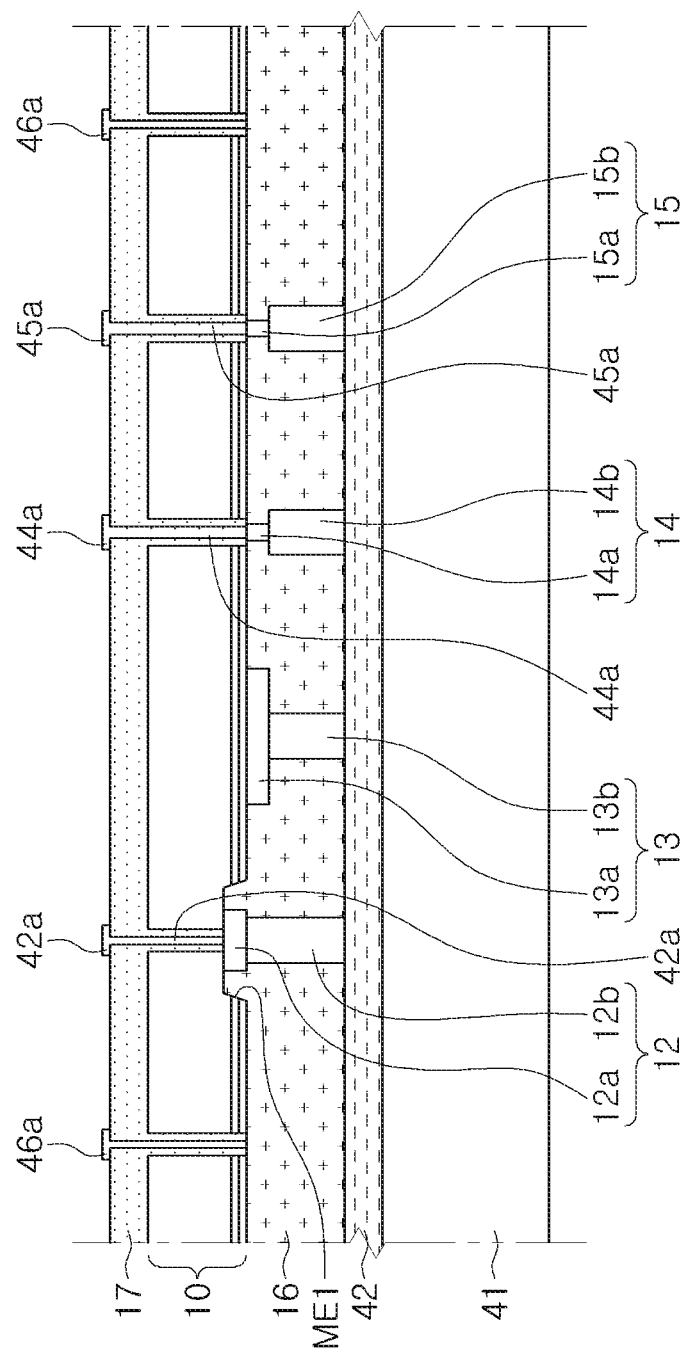

Next, as illustrated in FIG. 21, as the secondary holes V1a', V2', V3a', and TH1' are filled with a metallic material to form conductive vias 42a, 44a, and 45a, and the first partition 46a.

The conductive vias 42a, 44a, and 45a formed in this process of forming conductive vias and the first partition 46a may be connected to electrodes 12, 14, and 15 of the first semiconductor light emitting unit 10, respectively. The first partition 46a may be formed using a metallic material the same as that of the conductive vias 42a, 44a, and 45a. The first partition 46a that is the metallic material may effectively prevent light interference between pixels.

Figure 22:
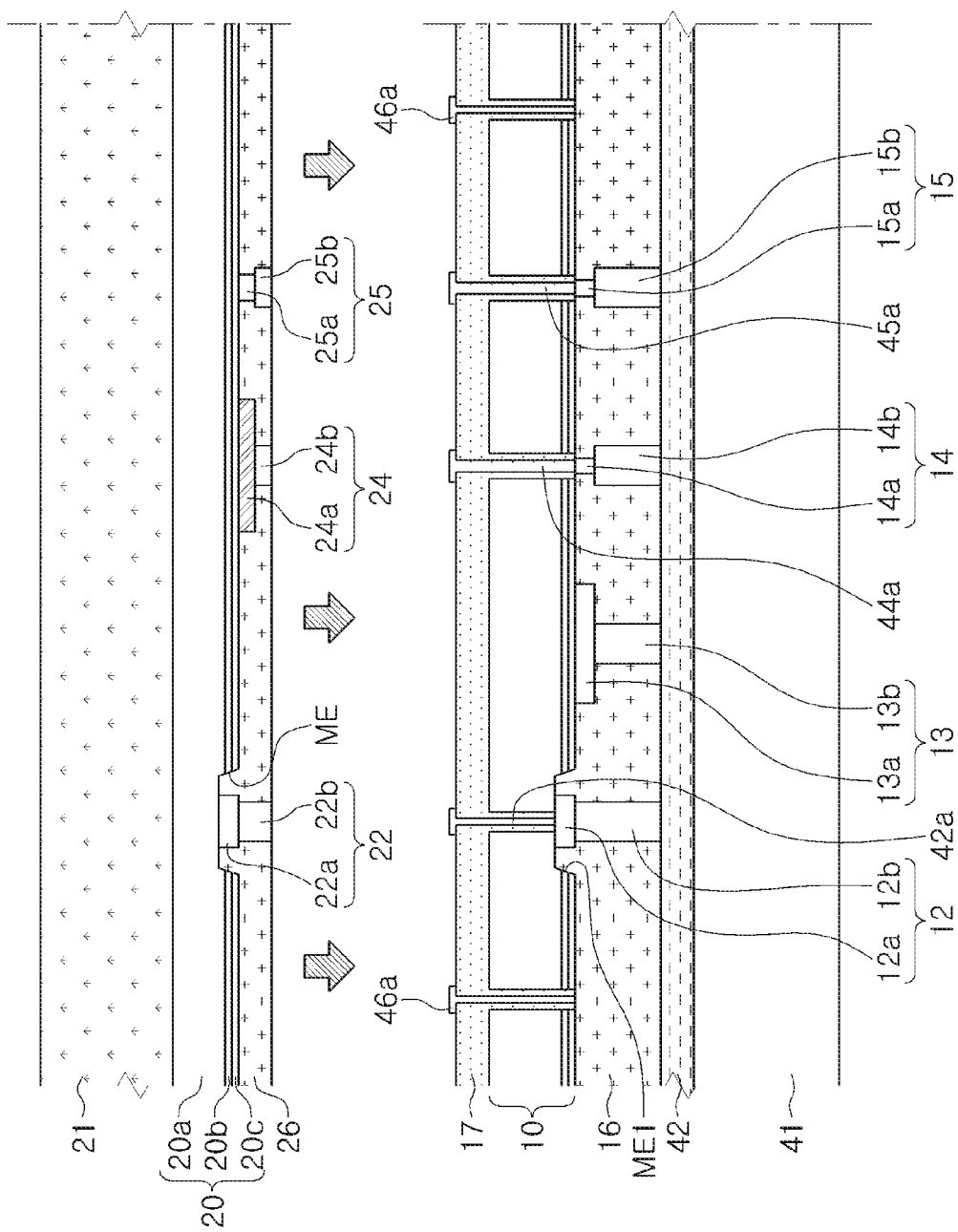

As illustrated in FIG. 22, the second semiconductor light emitting unit 20 illustrated in FIG. 14 may be bonded to the first semiconductor light emitting unit 10.

This bonding process may be performed by pressing the first insulating layer 17 of the first semiconductor light emitting unit 10 and the second insulating layer 26 of the second semiconductor light emitting unit 20 at a high temperature. Without the use of an additional resin for bonding, bonding with a desired degree of strength may be obtained. In this bonding process, the electrodes 22, 24, and 25 of the second semiconductor light emitting unit 20 may be connected to the conductive vias 42a, 44a, and 45a of the first semiconductor light emitting unit 10, respectively.

Figure 23:
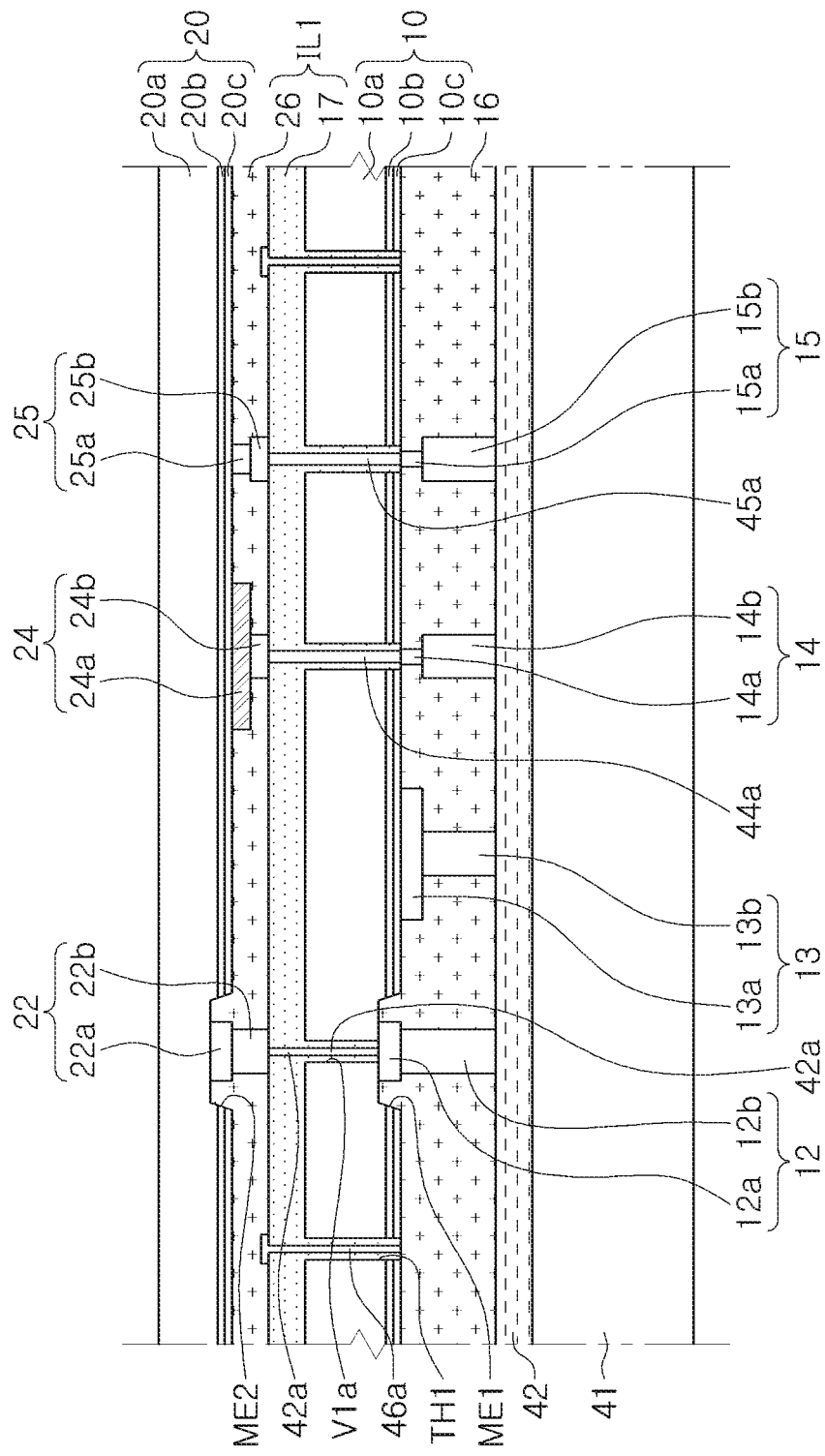

Next, as illustrated in FIG. 23, the growth substrate 21 may be removed from the second semiconductor light emitting unit 20.

This substrate removal process may be performed by using a laser lift-off and/or mechanical/chemical polishing process. In a manner similar to a foregoing process, an additional grinding process may be applied to a surface of the second semiconductor light emitting unit 20 from which the growth substrate 21 is removed.

Figure 24:
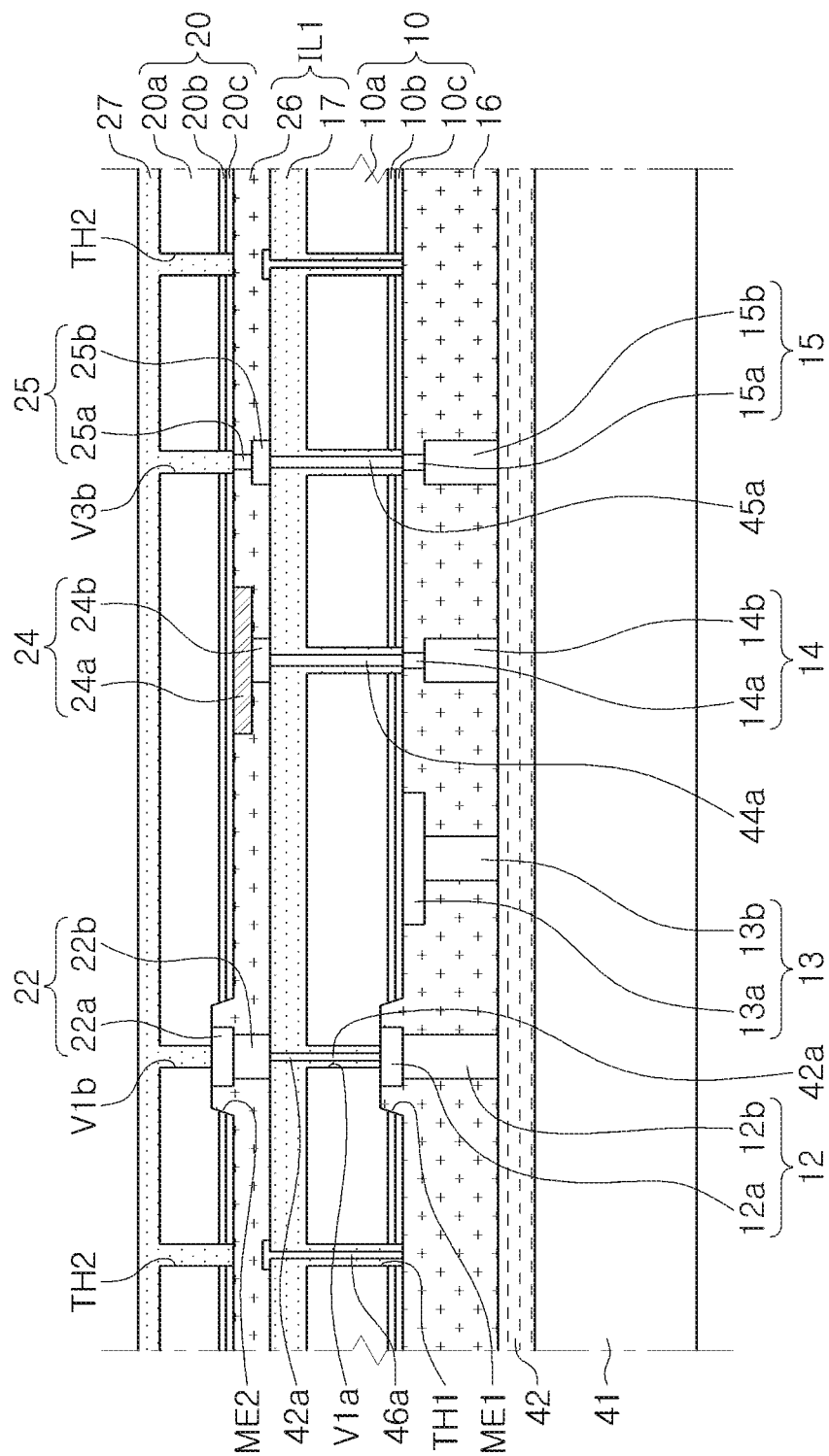

Next, as illustrated in FIG. 24, the holes V1b, V3b, and TH2 for formation of an electrode structure and a partition structure may be formed in the second semiconductor light emitting unit 20, and a third insulating layer 27 may be formed on the second semiconductor light emitting unit 20 to fill the holes V1b, V3b, and TH2 therewith.

The holes V1b and V3b for the electrode structure may be provided as vertical paths for a connection of the electrodes 22 and 25 of the second semiconductor light emitting unit 20 with the second semiconductor light emitting unit 20 to form the common electrode CE and the third individual electrode E3. The hole TH2 for formation of the partition structure may be formed in a position corresponding to the first partition 46a.

Figure 25:
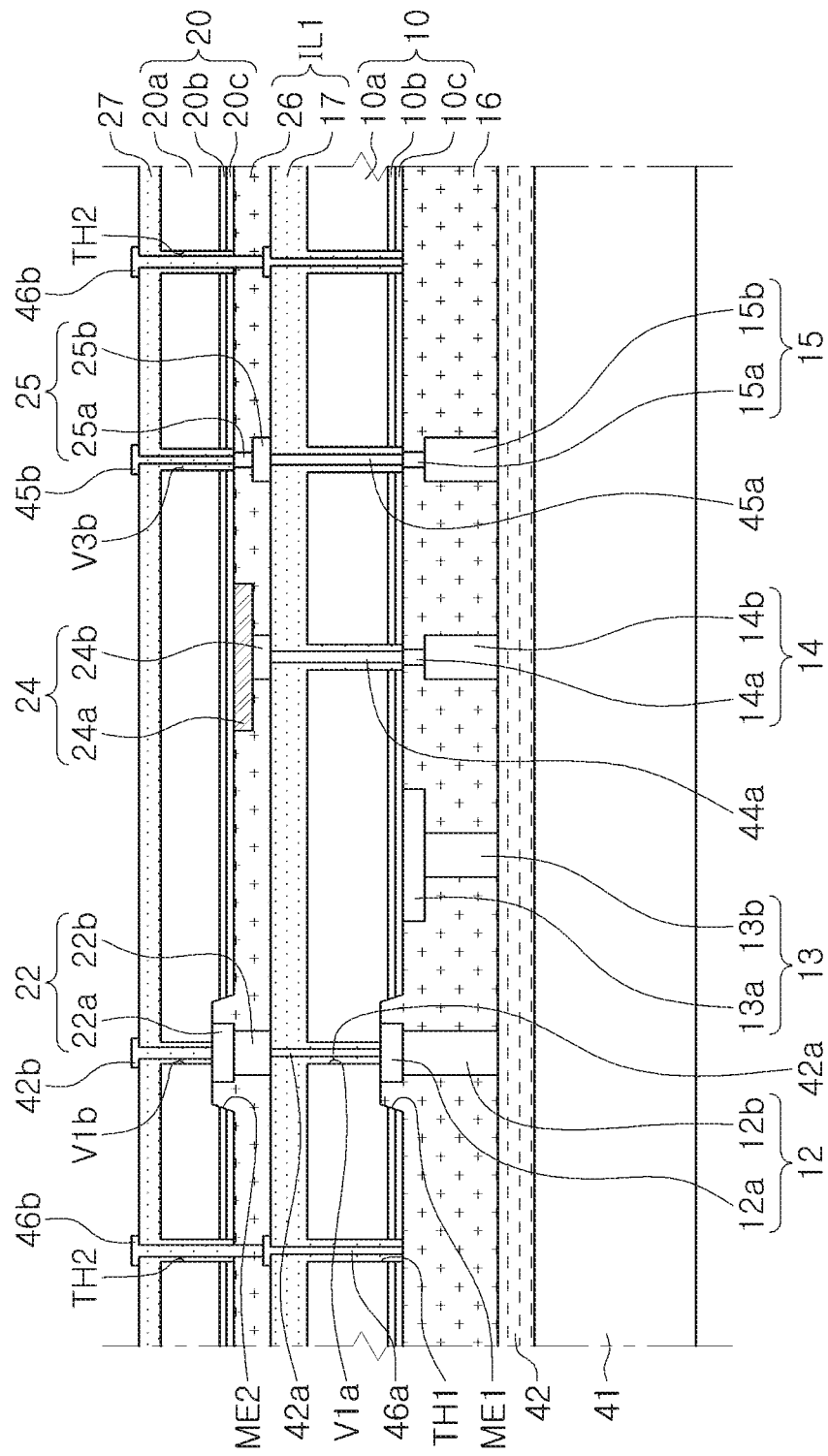

Next, as illustrated in FIG. 25, after a material with which the holes V1b, V3b, and TH2 are filled is partially removed to form the secondary holes, as the secondary holes are filled with a metallic material to form conductive vias 42b and 45b, and a second partition 46b.

By this process, as a material of the third insulating layer 27 remains around the conductive vias 42b and 45b and the second partition 46b, an undesired connection of the second semiconductor light emitting unit 20 may be prevented. The conductive vias 42b and 45b formed in this process may be connected to the electrodes 22 and 25 of the second semiconductor light emitting unit 20, respectively. The second partition 46b may be formed to be connected to the first partition 46a. The second partition 46b may be formed using a metallic material the same as the conductive vias 42b and 45b.

Figure 26:
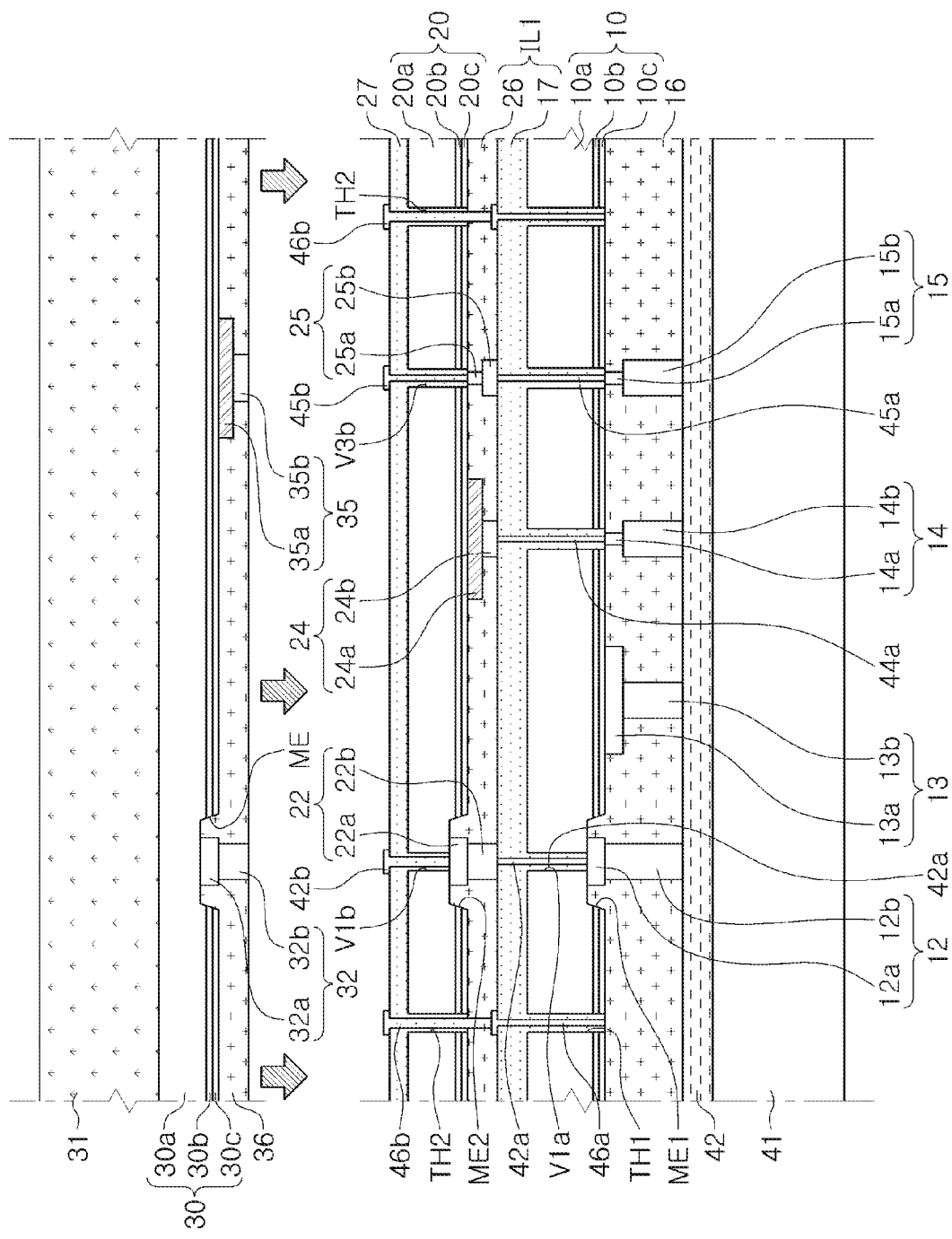

Next, as illustrated in FIG. 26, the third semiconductor light emitting unit 30 illustrated in FIG. 15 may be bonded to the second semiconductor light emitting unit 20.

This bonding process may be performed by pressing the third insulating layer 27 of the second semiconductor light emitting unit 20 and the fourth insulating layer 36 of the third semiconductor light emitting unit 30 at a high temperature. Without the use of an additional resin for bonding, bonding with a desired degree of strength may be performed. In this bonding process, the electrodes 32 and 35 of the third semiconductor light emitting unit 30 may be connected to the conductive vias 42b and 45b of the second semiconductor light emitting unit 20, respectively.

Figure 27:
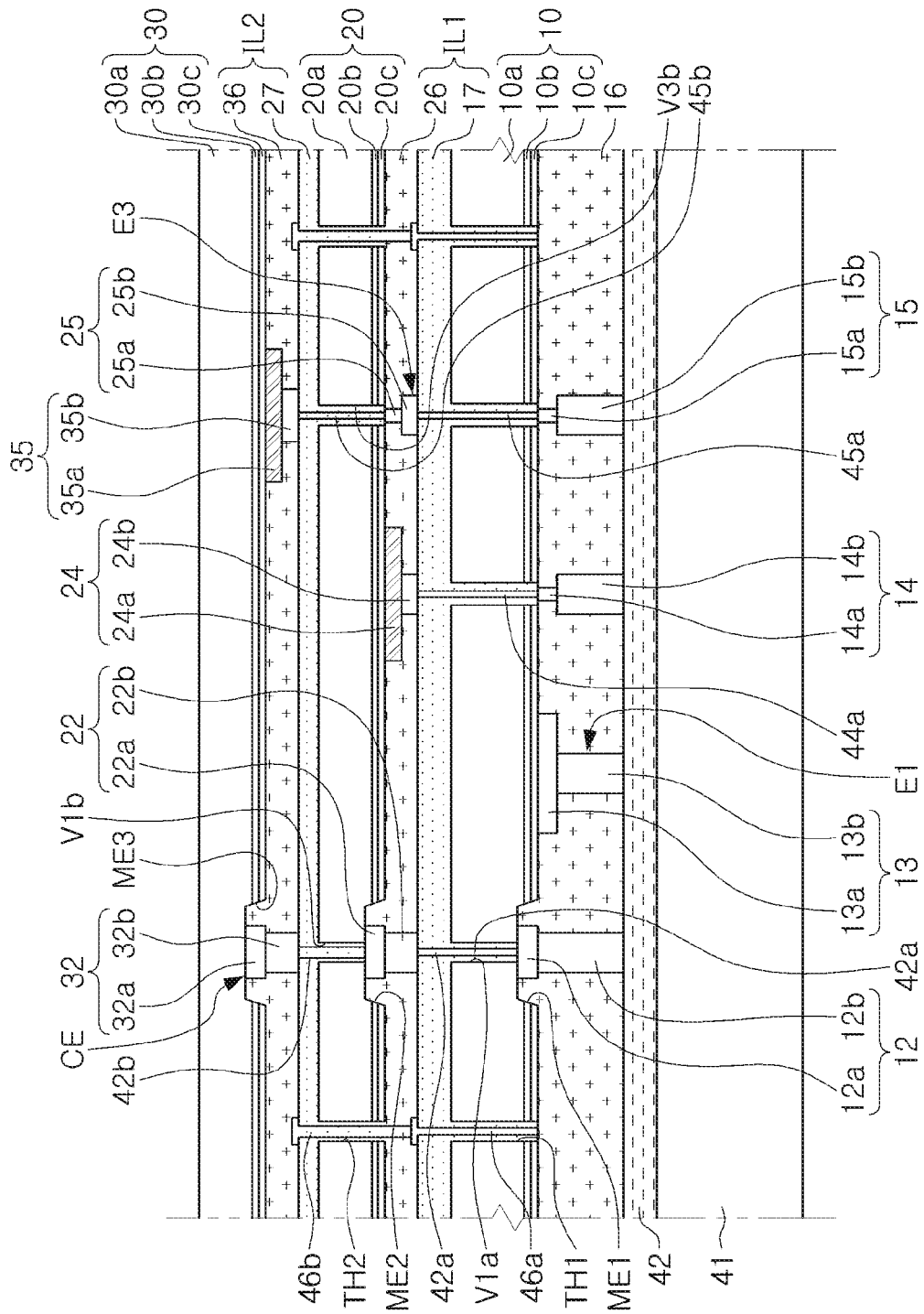

Next, as illustrated in FIG. 27, the growth substrate 31 may be removed from the third semiconductor light emitting unit 30.

This substrate removal process may be performed by using a laser lift-off and/or mechanical/chemical polishing process. In a manner similar to a foregoing process, an additional grinding process may be applied to a surface of the third semiconductor light emitting unit 30 from which the growth substrate 31 is removed.

As described above, the common electrode CE may be connected to the first conductivity-type semiconductor layers 10a, 20a, and 30a of the first to third semiconductor light emitting units 10, 20, and 30 in common while passing through the base insulating layer 16, the first semiconductor light emitting unit 10, the second semiconductor light emitting unit 20, the first interlayer insulating layer IL1, and the second interlayer insulating layer IL2. The third individual electrode E3 may be connected to the second conductivity-type semiconductor layer 30c of the third semiconductor light emitting unit 30 while passing through the base insulating layer 16, the first semiconductor light emitting unit 10, the second semiconductor light emitting unit 20, the first interlayer insulating layer IL1, and the second interlayer insulating layer IL2.

Figure 28:
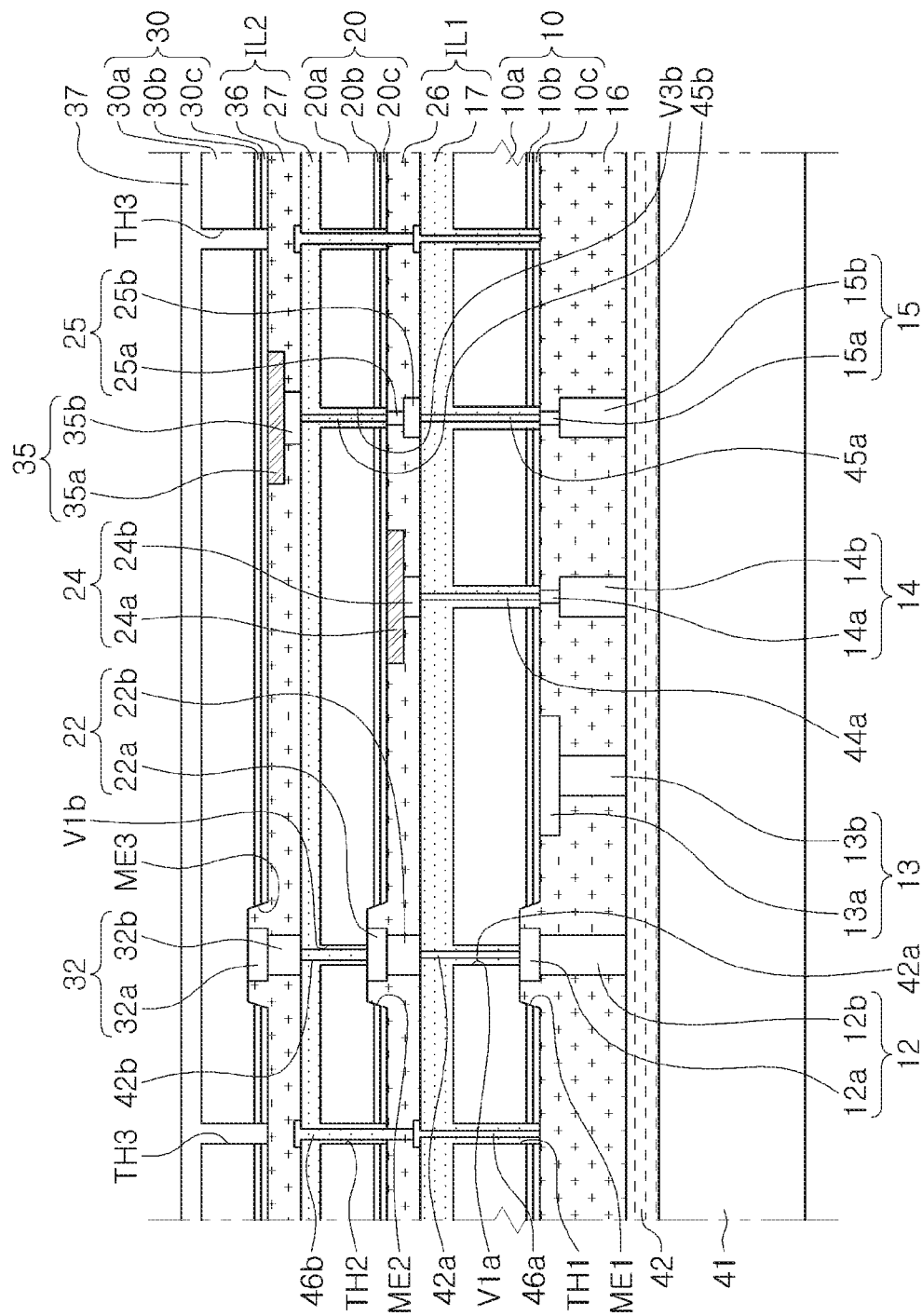

Next, as illustrated in FIG. 28, a hole TH3 for formation of a partition structure may be formed in the third semiconductor light emitting unit 30, and the outer insulating layer 37 may be formed on the third semiconductor light emitting unit 30 to allow the hole TH3 to be filled therewith.

The hole TH3 for formation of the partition structure may be formed in a position corresponding to the second partition 46b, and the outer insulating layer 37 provided as a light-transmissive protective layer may serve to protect a panel.

Figure 29:
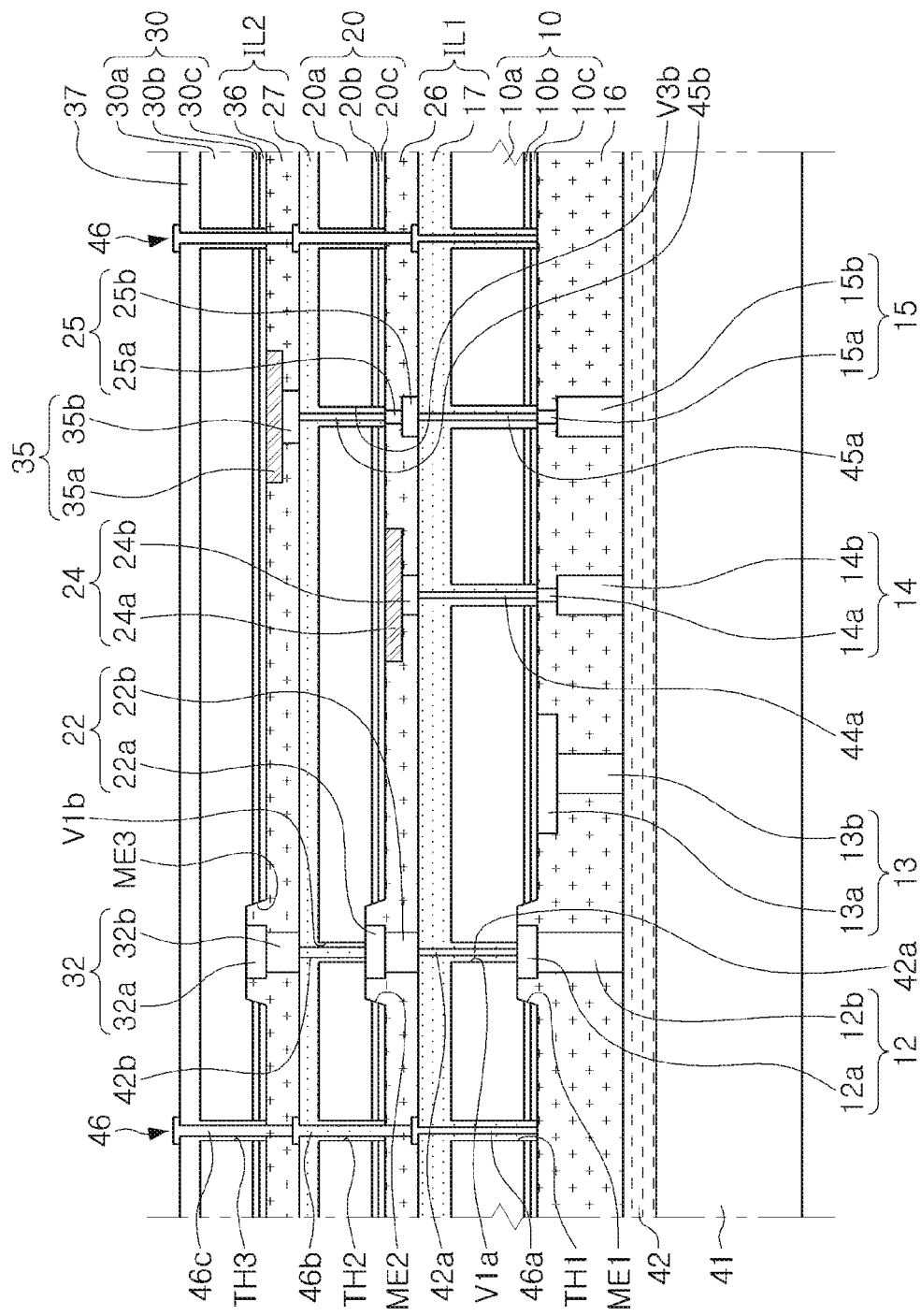

Next, as illustrated in FIG. 29, after a material with which the hole TH3 is filled, is partially removed to form secondary holes, the secondary holes are filled with a metallic material to form a third partition 46c.

The third partition 46c may be formed to be connected to the second partition 46b. The third partition 46c allows a pixel PA area to be defined and the partition structure 46 preventing light interference between pixels to be provided, with the first partition 46a and the second partition 46b connected to each other in series.

Figure 30:
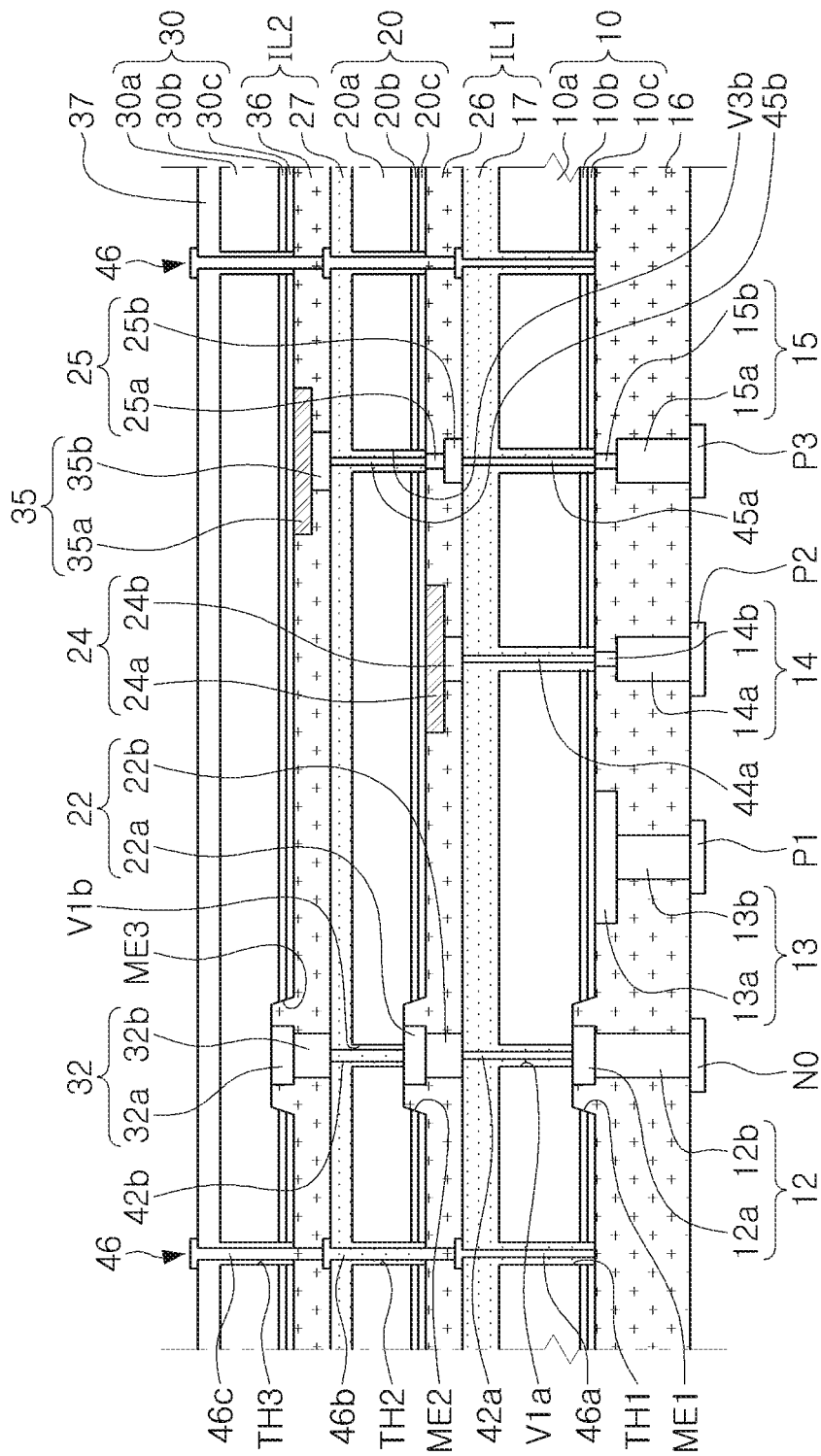

Next, as illustrated in FIG. 30, the support substrate 41 is removed, and the common electrode pad N0, and the first to third individual electrode pads P1, P2, and P3 may be formed on the electrodes 12, 13, 14, and 15, exposed to a lower surface of the base insulating layer 16a, respectively.

In a manufacturing method according to an example embodiment, while being stacked for vertical connectivity between semiconductor light emitting units, a via formation process may be performed. In this via formation process, an etching stop layer may be adopted for various purposes.

FIGS. 31, 32, 33, 34, and 35 are cross-sectional views of a method of manufacturing the LED light source module 50, according to an example embodiment. A process illustrated in FIG. 31 may be understood as a process performed after a mesa-etching process in FIG. 10.

Figure 31:
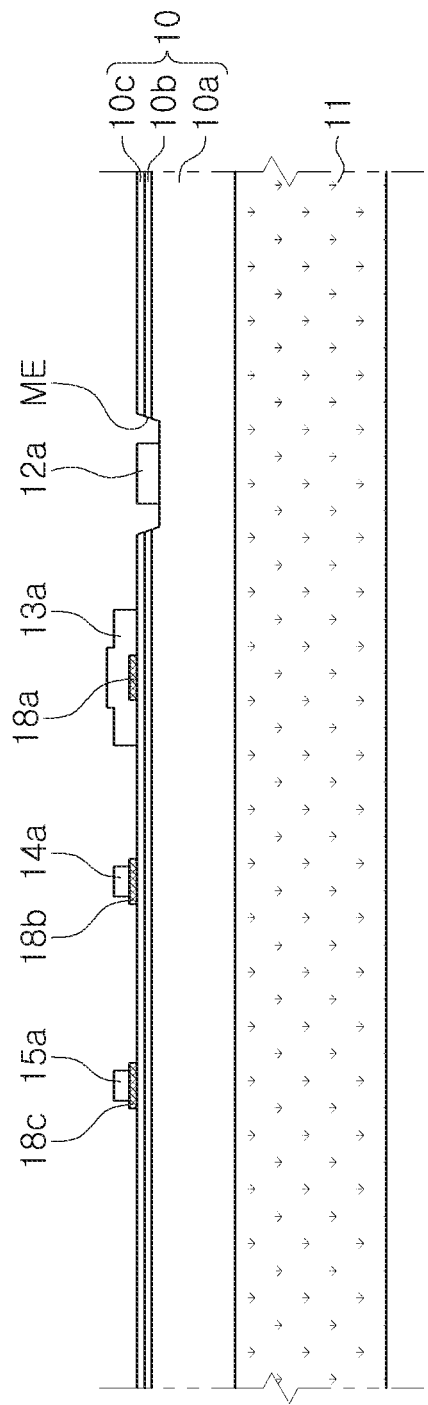
FIGS. 31, 32, 33, 34, 35, and 36 are cross-sectional views of a method of manufacturing an LED light source module, according to an example embodiment.

As illustrated in FIG. 31, in a manner similar to a process illustrated in FIG. 11, the electrode layers 12a, 13a, 14a, and 15a may be formed on an exposed region ME1 of the first conductivity-type semiconductor layer 10a and portions of the second conductivity-type semiconductor layer 10c. However, in a manner different from an example embodiment described previously, before the electrode layers 14a and 15a are formed, etching stop layers 18b and 18c may be adopted on the second conductivity-type semiconductor layer 10c. The etching stop layers 18b and 18c employed in an example embodiment may be an insulating material layer, but are not limited thereto. As the etching stop layers 18b and 18c formed using an insulating material are provided below the at least noncontact electrodes 14a and 15a, electrical insulation from the second semiconductor light emitting unit 20 may be stably secured. Additionally, before the electrode layer 13a is formed, a current blocking layer 18a may be formed using an insulating material the same as the etching stop layers 18b and 18c on the second conductivity-type semiconductor layer 10c. The current blocking layer 18a may allow a current from being disposed through the electrode layer 13a.

Figure 32:
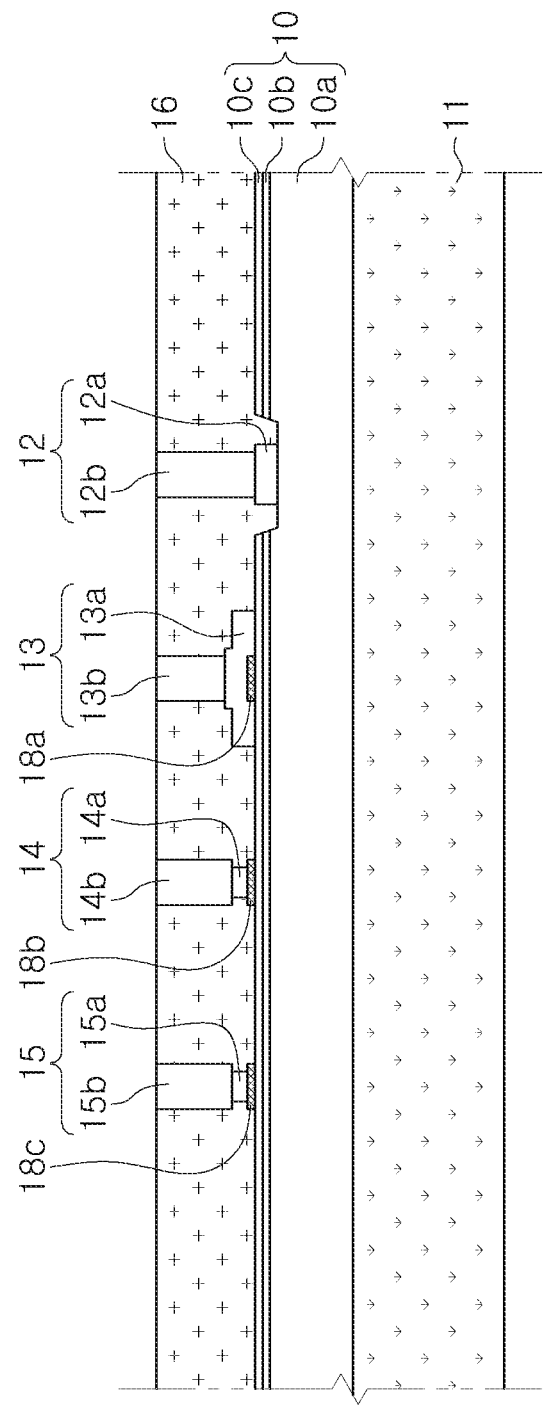

Next, as illustrated in FIG. 32, the electrode posts 12b, 13b, 14b, and 15b are formed on the electrode layers 12a, 13a, 14a, and 15a, respectively, and the base insulating layer 16 may be formed to allow the electrodes 12, 13, 14, and 15 to be exposed.

The electrode posts 12b, 13b, 14b, and 15b may be formed to have a constant height on the contact electrodes 12a and 13a and the noncontact electrodes 14a and 15a. An insulating material for the base insulating layer 16 is formed to have a sufficient thickness to allow the electrodes 12, 13, 14, and 15 to be covered therewith, and surfaces of the electrodes 12, 13, 14, and 15 may be exposed through a grinding process. In addition, through the grinding process, a surface 16A of the base insulating layer 16 may be provided as a flat surface for bonding.

Figure 33:
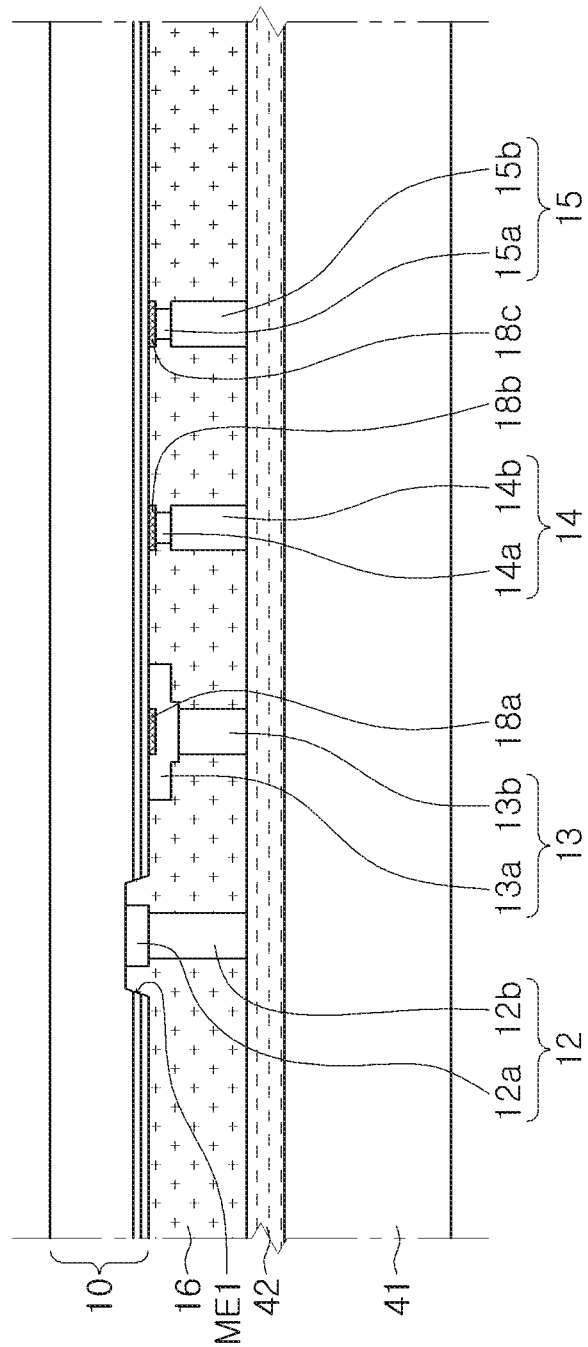

Next, as illustrated in FIG. 33, in a manner similar to example embodiments (FIGS. 16 and 17) described previously, after the first semiconductor light emitting unit 10 is bonded to the support substrate 41 using the bonding layer 42, the growth substrate 11 may be removed from the first semiconductor light emitting unit 10.

Figure 34:
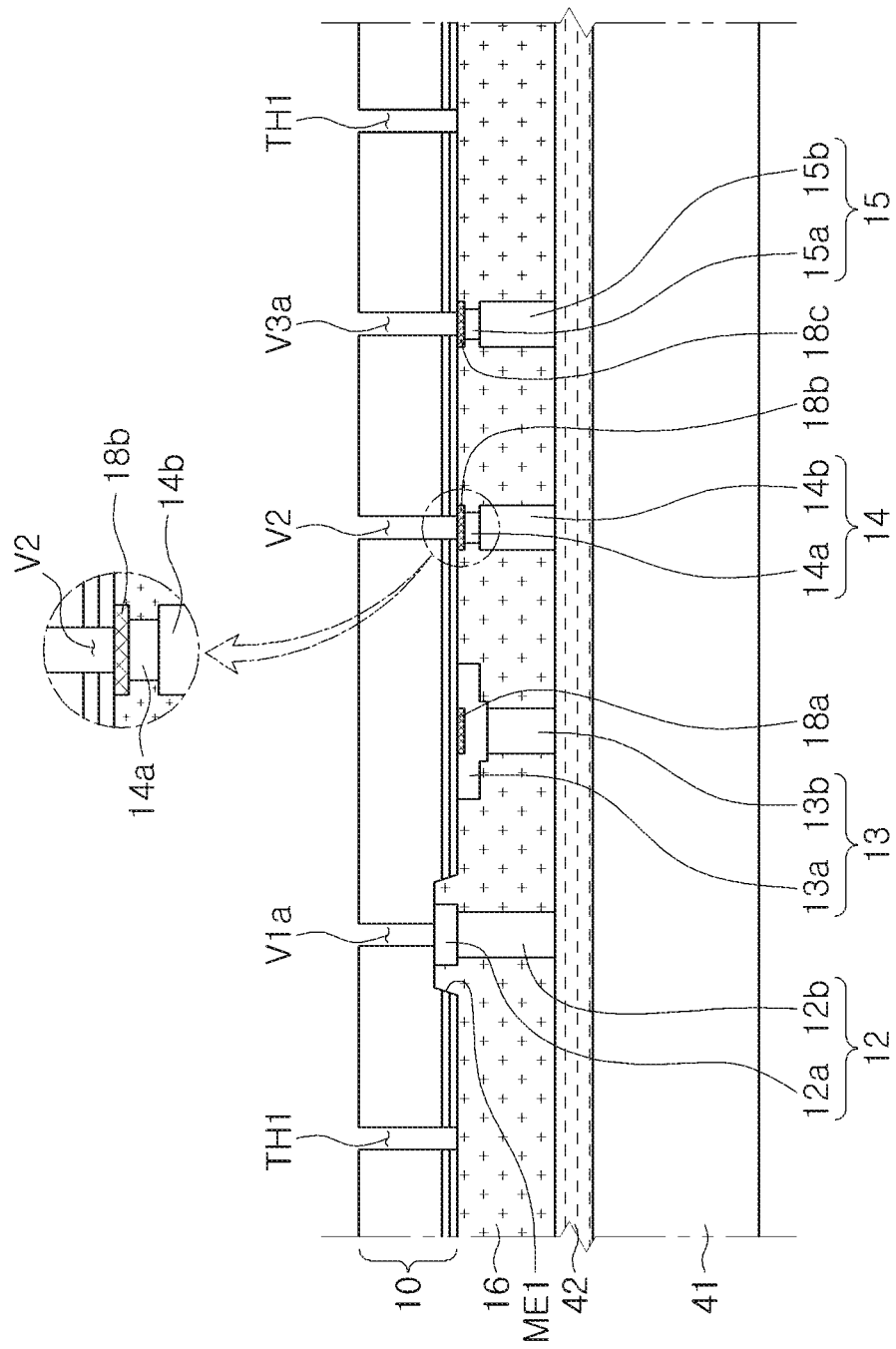

Next, as illustrated in FIG. 34, the holes V1a, V2, V3a, and TH1 for formation of an electrode structure and a partition structure may be formed on the first semiconductor light emitting unit 10. In this etching process, the etching stop layers 18b and 18c may allow an etching depth to be adjusted exactly. In addition, the etching stop layers 18b and 18c may prevent surfaces of the noncontact electrodes 14a and 15a to be connected to another conductive vias in a subsequent process from being damaged. In detail, when the etching stop layers 18b and 18c are formed using an insulating material, the noncontact electrodes 14a and 15a may be spaced apart from the first semiconductor light emitting unit 10 at regular intervals by the etching stop layers 18b and 18c, two components, the noncontact electrode and the first semiconductor light emitting unit, may be easily insulated from each other.

Figure 35:
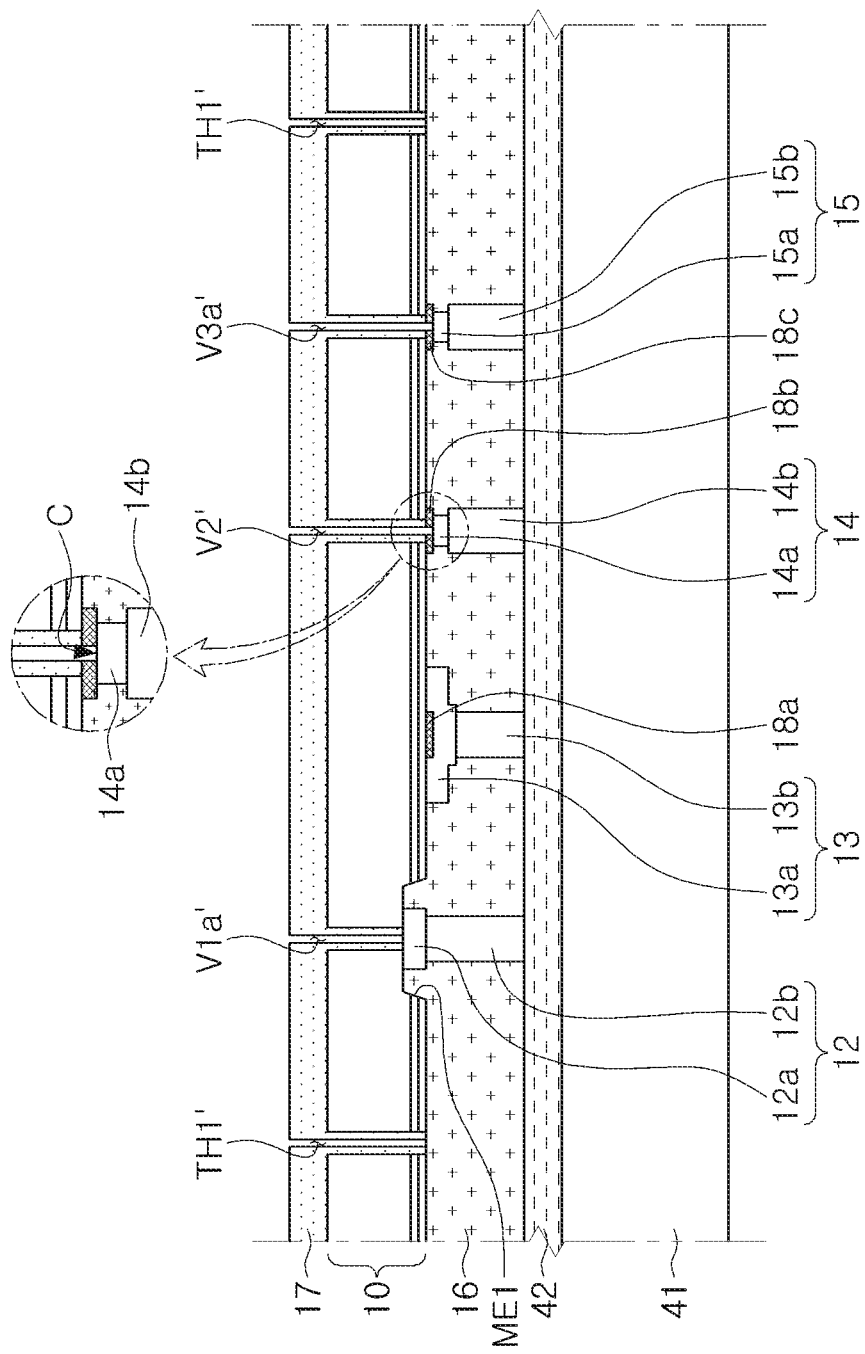

Next, as illustrated in FIG. 35, the first insulating layer 17 is formed on the first semiconductor light emitting unit 10 to allow the holes V1a, V2, V3a, and TH1 to be filled therewith, and a material with which the holes V1a, V2, V3a, and TH1 are filled is partially removed to form the secondary holes V1a',V2',V3a', and TH1'.

Figure 36:
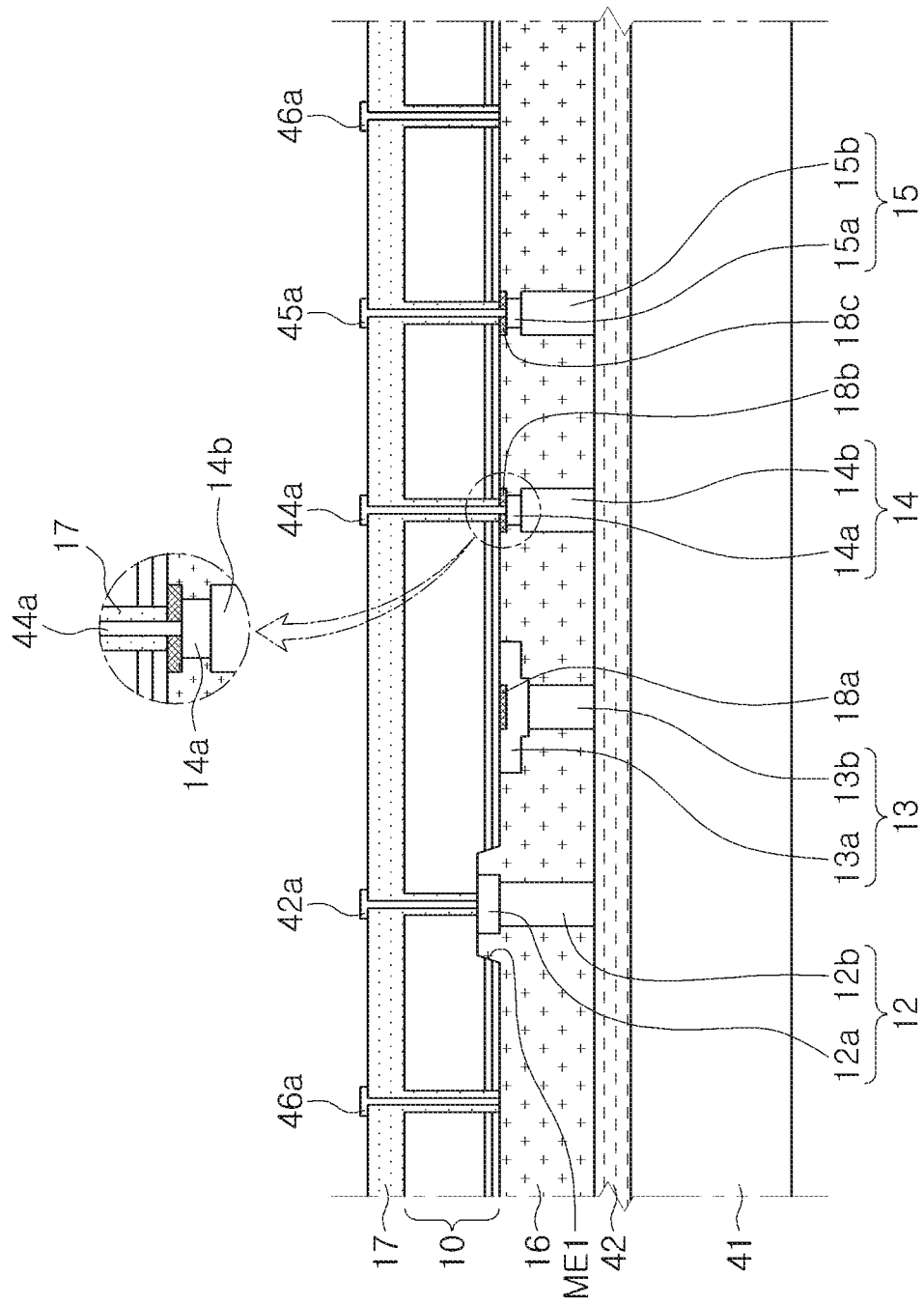

After the first insulating layer 17 is formed, a surface thereof may be leveled through an additional grinding process. In an example embodiment, in a process for a secondary hole, the etching stop layers 18b and 18c may be partially removed together to allow the noncontact electrodes 14a and 15a to be exposed at a surface C. By this process, without an additional process, the conductive vias 44a and 45a formed in the process illustrated in FIG. 36 may be easily connected to the noncontact electrodes 14a and 15a, respectively.

As described above, the etching stop layers 18b and 18c allow an etching depth to be adjusted, an electrode surface to be protected, and a vertical connection structure (for example, a common electrode, a second individual electrode, and a third individual electrode) including the noncontact electrodes 14a and 15a to be formed.

Figure 37:
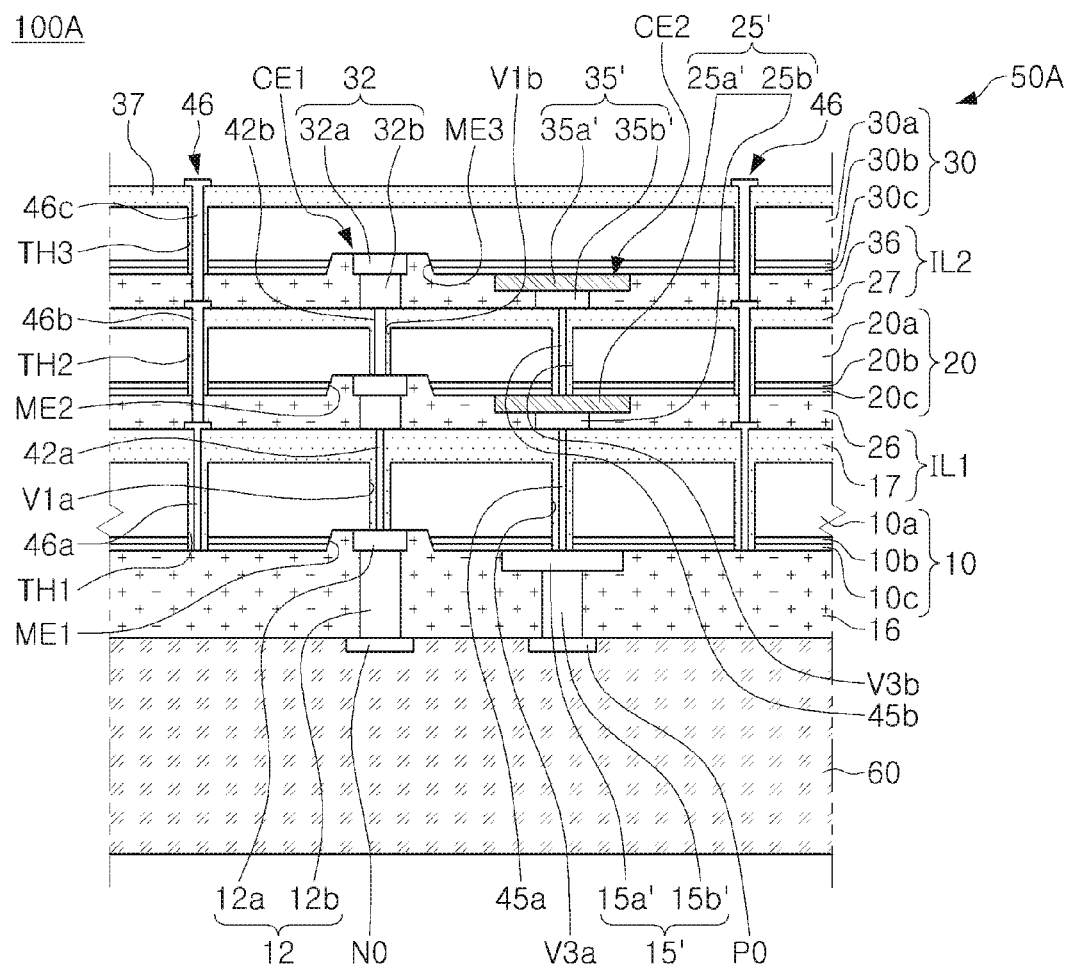
FIG. 37 is a side view illustrating a display panel according to an example embodiment.

FIG. 37 is a side view illustrating a display panel 100A according to an example embodiment.

With reference to FIG. 37, the display panel 100A includes a circuit board 60 and an LED light source module 50A disposed on the circuit board.

The LED light source module 50A according to an example embodiment may be understood to have a structure similar to the LED light source module 50 illustrated in FIGS. 4 to 7 (particularly FIG. 7) except that both electrodes of first to third semiconductor light emitting units 10, 20, and 30 are provided as common electrodes CE1 and CE2. A component of an example embodiment is understood with reference to a description the same as or similar to the LED light source module 50 illustrated in FIGS. 4 to 7 unless the component of an example embodiment is described to be opposed thereto.

The first common electrode CE1 and the second common electrode CE2 employed in an example embodiment may have a through electrode structure. The first common electrode CE1 may be connected to the first conductivity-type semiconductor layers 10a, 20a, and 30a of the first to third semiconductor light emitting units 10, 20, and 30 in common while passing through the base insulating layer 16, the first semiconductor light emitting unit 10, the second semiconductor light emitting unit 20, the first interlayer insulating layer IL1, and the second interlayer insulating layer IL2 in a manner similar to the common electrode CE illustrated in FIG. 7.

In an example embodiment, in a manner different from the example embodiment described previously, the second common electrode CE2 having another polarity may be connected to the second conductivity-type semiconductor layers 10c, 20c, and 30c of the first to third semiconductor light emitting units 10, 20, and 30 in common, while passing through the base insulating layer 16, the first semiconductor light emitting unit 10, the second semiconductor light emitting unit 20, the first interlayer insulating layer IL1, and the second interlayer insulating layer IL2 rather than the individual electrode.

The second common electrode CE2 may include a fourth electrode 15' disposed inside the base insulating layer 16 and connected to the second conductivity-type semiconductor layer 10c of the first semiconductor light emitting unit 10, a third conductive via 45a connected to the fourth electrode 15' and passing through the first semiconductor light emitting unit 10, a fifth electrode 25' connected to the third conductive via 45a and connected to the second conductivity-type semiconductor layer 20c of the second semiconductor light emitting unit 20 inside the first interlayer insulating layer IL1, a fourth conductive via 45b connected to the fifth electrode 25' and passing through the second semiconductor light emitting unit 30, and a sixth electrode 35' connected to the fourth conductive via 45b and connected to the second conductivity-type semiconductor layer 30c of the third semiconductor light emitting unit 30 inside the second interlayer insulating layer IL2. In an example embodiment, the fourth to sixth electrodes 15', 25', and 35' may include contact electrodes 15a', 25a', and 35a', and electrode posts 15b', 25b', and 35b' disposed on the contact electrodes 15a', 25a', and 35a', respectively.

First and second common electrode pads N0 and P0 may be provided on a lower surface of the base insulating layer 16 to be connected to the first common electrode CE1 and the second common electrode CE2, respectively.

When a voltage is applied to the first common electrode pad N0 and the second common electrode pad P0, red, green, and blue light is emitted from the first to third semiconductor light emitting units 10, 20, and 30. Thus, the red, green, and blue light is combined to emit white light. As described above, the LED light source module 50A may be configured to provide white light.

Figure 38:
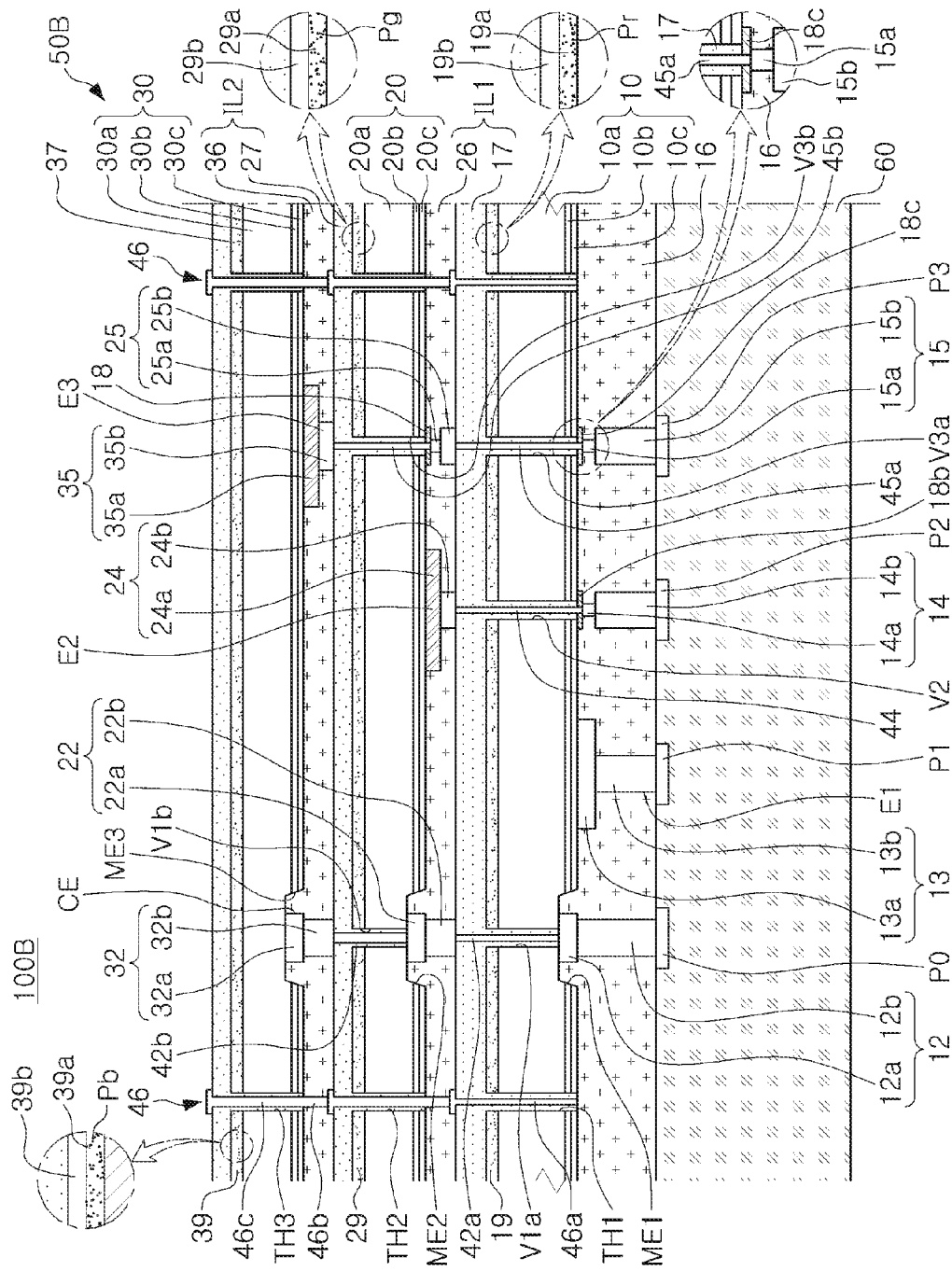
FIG. 38 is a side view illustrating a display panel according to an example embodiment of the present inventive concept.

FIG. 38 is a side view illustrating a display panel 100B according to an example embodiment.

With reference to FIG. 38, the display panel 100B includes a circuit board 60 and an LED light source module 50B disposed on the circuit board 60.

The LED light source module 50B according to an example embodiment is understood to have a structure similar to the light source module 50 illustrated in FIGS. 4 to 7 (particularly, FIG. 7) except that the first to third semiconductor light emitting units 10, 20, and 30 adopt different wavelength converting layers while emitting light having the same wavelength. A component of an example embodiment may be understood with reference to a description with respect to a component the same as or similar to the LED light source module 50 illustrated in FIGS. 4 to 7 unless the component of an example embodiment is described to be opposite thereto.

Active layers 10b, 20b, and 30b of the first to third semiconductor light emitting units 10, 20, and 30 may emit light having the same wavelength. Each of the active layers 10b, 20b, and 30b in an example embodiment may emit ultraviolet light (having a wavelength of, for example, 380 nm to 440 nm). The first to third semiconductor light emitting units 10, 20, and 30 may include first to third light-adjusting units 19, 29, and 39 disposed on upper surfaces thereof, respectively. The first light-adjusting unit 19 may include a first wavelength converting layer 19a containing a wavelength conversion material Pr converting ultraviolet light into red light. The second light-adjusting unit 29 may include a second wavelength converting layer 29a containing a wavelength conversion material Pg for converting ultraviolet light into green light. The third light-adjusting unit 39 may include a third wavelength converting layer 39a containing a wavelength conversion material Pb converting ultraviolet light into blue light.

The first light-adjusting unit 19 and the second light-adjusting unit 29 may include a first optical filter layer 19b and a second optical filter layer 29b disposed on the first wavelength converting layer 19a and the second wavelength converting layer 29a, respectively. The first optical filter layer 19b and the second optical filter layer 29b may prevent an undesired color of light from being generated as light emitted from the second semiconductor light emitting unit 20 or the third semiconductor light emitting unit 30 is absorbed into the first wavelength converting layer 19a and the second wavelength converting layer 29a disposed below the first optical filter layer and the second optical filter layer, respectively. The first optical filter layer 19b may block ultraviolet, blue, and green light, and the second optical filter layer 29b may block ultraviolet light and blue light. In a manner different from an example embodiment, an optical filter layer for blocking ultraviolet light is not adopted, or only adopted in a portion of the semiconductor light emitting unit. As in an example embodiment, a light diffusion layer 39b may be disposed on the third wavelength converting layer 39a.

The example embodiments may be variously implemented. For example, the active layers of the first to third semiconductor light emitting units emit blue light, the first semiconductor light emitting unit and the second semiconductor light emitting unit include a first wavelength converting layer and a second wavelength converting layer disposed on upper surfaces thereof, respectively, and the first wavelength converting layer and the second wavelength converting layer may convert blue light into red light and green light, respectively. Additionally, the first semiconductor light emitting unit may further include a first optical filter layer disposed on the first wavelength converting layer and blocking blue light and green light, and the second semiconductor light emitting unit may further include a second optical filter layer disposed on the second wavelength converting layer and blocking blue light.

At least two semiconductor light emitting units of the first to third semiconductor light emitting units include active layers emitting light having substantially the same wavelength, and at least one semiconductor light emitting unit of the at least two semiconductor light emitting units may include a wavelength converting layer, but it is not limited thereto.

In the foregoing embodiments, an LED light source module employed in a display panel is mainly described, but an LED light source module according to an example embodiment may be employed in various devices such as a lighting device.

Figure 39:
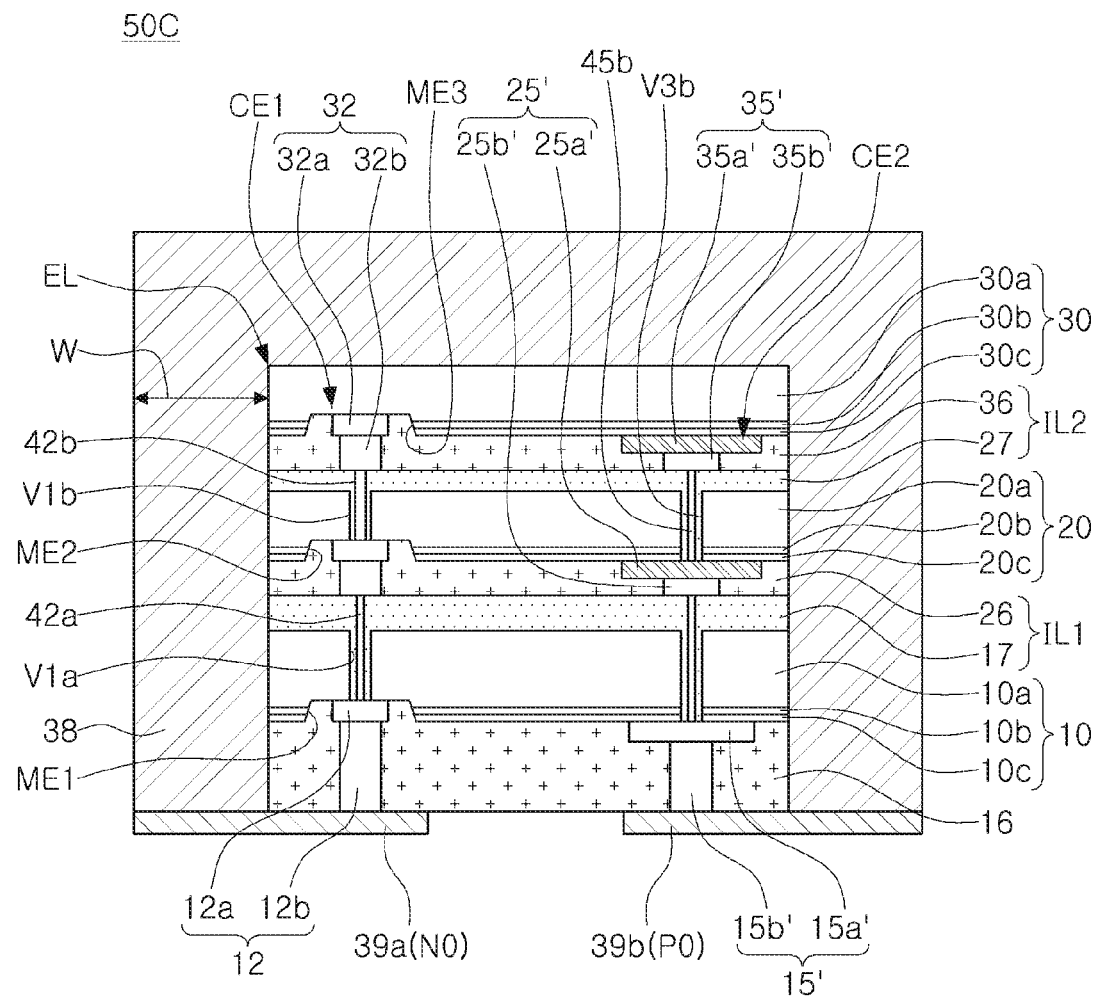
FIG. 39 is a side view illustrating an LED light source module according to an example embodiment.
Figure 40:
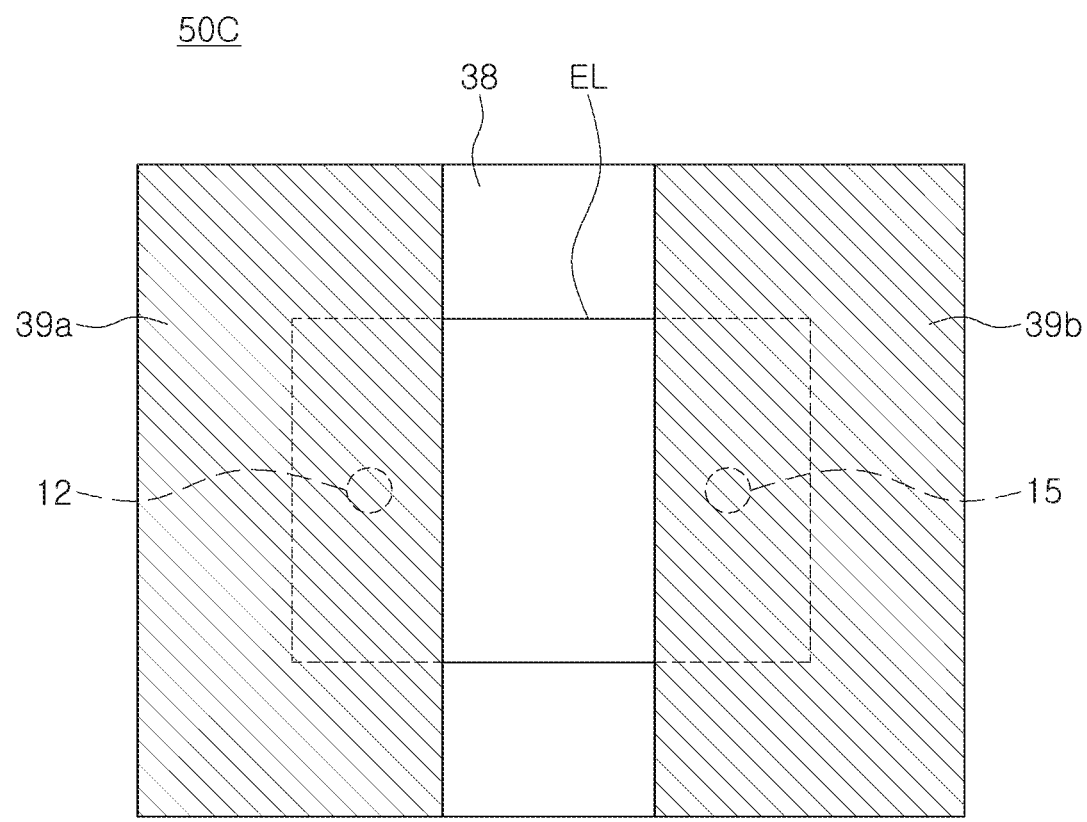
FIG. 40 is a bottom view illustrating a pad arrangement of the LED light source module illustrated in FIG. 39.

FIG. 39 is a side view illustrating an LED light source module 50C according to an example embodiment. FIG. 40 is a bottom view illustrating a pad arrangement of the LED light source module 50C illustrated in FIG. 39. In a manner similar to the foregoing embodiments, the LED light source module 50C according to an example embodiment may include a light emitting stacked body EL having a first surface, a second surface opposing the first surface, and lateral surfaces disposed therebetween, and a first through electrode structure CE1 and a second through electrode structure CE2 passing through at least a portion of the light emitting stacked body EL.

The light emitting stacked body EL of the LED light source module 50C may have a structure similar to the light emitting stacked body of the light source module 50A illustrated in FIG. 37. A component of an example embodiment is understood with reference to a description with respect to a component the same as or similar to the LED light source module 50A illustrated in FIG. 37 unless the component of an example embodiment is described to be opposite thereto.

The light emitting stacked body EL may include a base insulating layer 16 allowing the first surface to be provided, first to third semiconductor light emitting units 10, 20, and 30 sequentially stacked on the base insulating layer 16, a first interlayer insulating layer IL1 disposed between the first semiconductor light emitting unit 10 and the second semiconductor light emitting unit 20 and a second interlayer insulating layer IL2 disposed between the second semiconductor light emitting unit 20 and the third semiconductor light emitting units 30.

The first to third semiconductor light emitting units 10, 20, and 30 may have first conductivity-type semiconductor layers 10*a*, 20*a*, and 30*a*, second conductivity-type semiconductor layers 10*c*, 20*c*, and 30*c*, and active layers 10*b*, 20*b*, and 30*b* disposed therebetween, respectively. As three semiconductor light emitting units are overlapped and stacked in the same region, luminance per unit area may be enhanced.

In the example embodiment, a form in which three semiconductor light emitting units 10, 20, and 30 are stacked, is exemplified, but is not limited thereto. Two or more semiconductor light emitting units may be adopted thereto. In addition, the three semiconductor light emitting units may emit light having different colors (for example, red, green, and blue), respectively, but may be configured to emit the same light or white light.

To be connected to the common electrode, the first through electrode structure CE1 and the second through electrode structure CE2, the first electrode pad 39*a* and the second electrode pad 39*b* may be provided in a first surface of the light emitting stacked body EL, in other words, a lower surface of the base insulating layer 16*a*.

The LED light source module 50C may further include an encapsulation layer 38 surrounding a second surface and lateral surfaces of the light emitting stacked body EL. The encapsulation layer 38 may include a light-transmissive resin. The encapsulation layer 38 may include a wavelength conversion material such as a phosphor. The encapsulation layer 38 may have a substantially flat surface coplanar with a first surface of the light emitting stacked body EL. An area of the surface may be properly adjusted according to a thickness W of the encapsulation layer 38. As illustrated in FIG. 40, the first electrode pad 39*a* and the second electrode pad 39*b* may be extended to a surface of the encapsulation layer 38 and disposed thereon. When the light emitting stacked body EL is small, and thus, a portion in which an electrode pad is formed is limited to be secured, the portion in which an electrode pad is formed may be secured by using the encapsulation layer 38.

A form in which the second through electrode structure CE2 employed in an example embodiment is connected to the second conductivity-type semiconductor layers 10*c*, 20*c*, and 30*c* of the first to third semiconductor light emitting units, is exemplified. However, as illustrated in FIG. 7, individual electrodes E1, E2, and E3 corresponding to the second through electrode structure may be provided as a plurality of individual electrodes, and may have a form in which the plurality of individual electrodes are selectively connected to the second conductivity-type semiconductor layers 10*c*, 20*c*, and 30*c* of the semiconductor light emitting units 10, 20, and 30, respectively.

Figure 41:
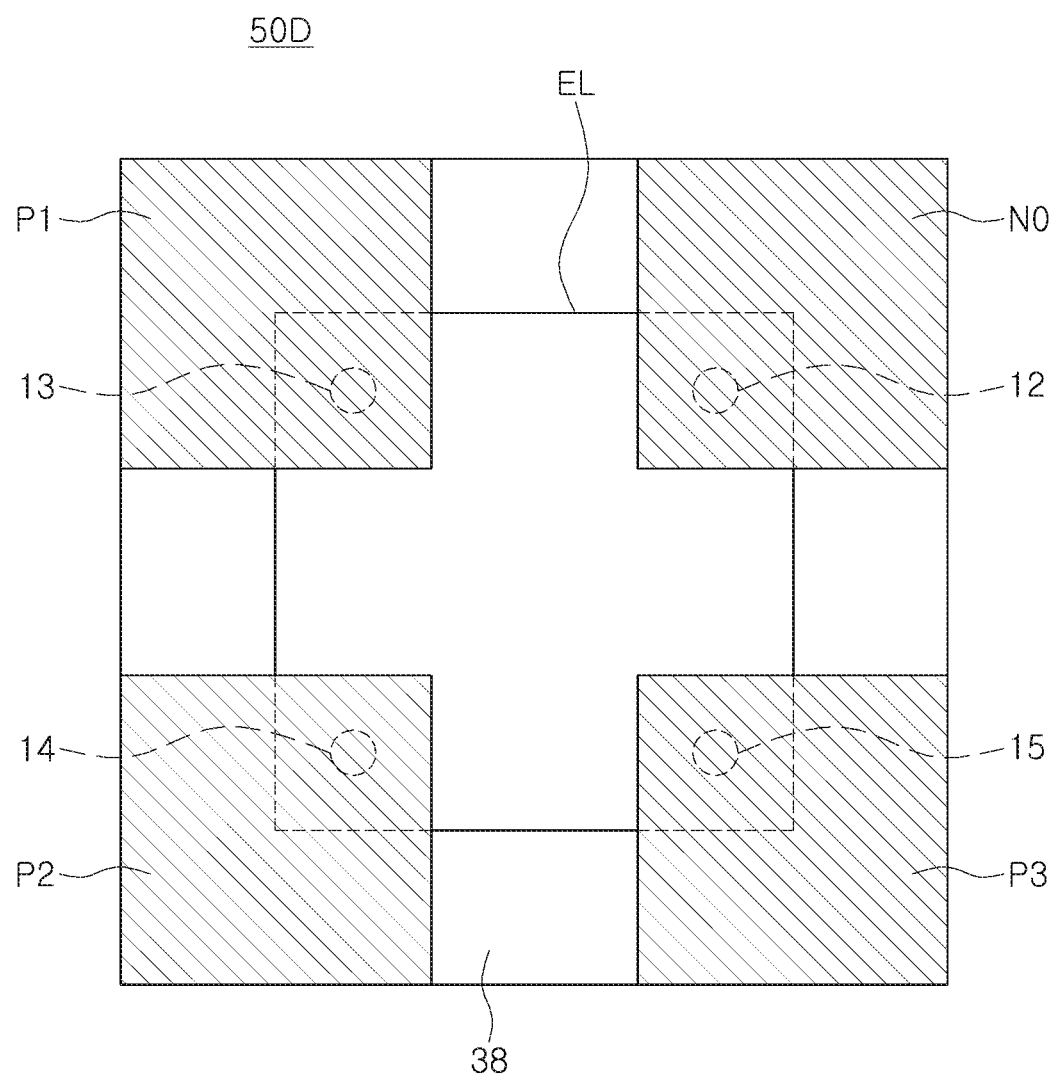
FIG. 41 is a bottom view illustrating a pad arrangement of an LED light source module according to an example embodiment.

FIG. 41 is a bottom view illustrating an electrode pad arrangement of an LED light source module 50D according to an example embodiment.

The LED light source module 50D illustrated in FIG. 41 is understood to have a through electrode structure similar to a light source module 50 illustrated in FIG. 7, in other words, a common electrode and first to third individual electrodes. In detail, as illustrated in FIG. 41, one common electrode pad N0 connected to an electrode portion 12 of the common electrode and three individual electrode pads P1, P2, and P3 connected to electrode portions 13, 14, and 15 of the first to third individual electrodes, respectively, are extended to a surface of the encapsulation layer 38 and formed to have a sufficient area.

As a material for converting a wavelength of light emitted from an LED pixel employed in an example embodiment, various materials such as a phosphor and/or a quantum dot may be used.

Phosphors may be represented by the following empirical formulae and have colors as below:

Oxide-based Phosphors: Yellow and green $Y_3Al_5O_{12}$:Ce, $Tb_3Al_5O_{12}$:Ce, $Lu_3Al_5O_{12}$:Ce Silicate-based Phosphors: Yellow and green $(Ba,Sr)_2SiO_4$:Eu, yellowish-orange $(Ba,Sr)_3SiO_5$:Ce Nitride-based Phosphors: Green $\beta$-SiAlON:Eu, yellow $La_3Si_6N_{11}$:Ce, yellowish-orange $\alpha$-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 \leq y \leq 4$)(here, Ln is at least one selected from a group consisting of a group IIIa element and a rare-earth element, and M is at least one selected from a group consisting of calcium (Ca), barium (Ba), strontium (Sr), and magnesium (Mg))

Fluoride-based Phosphors: red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ A composition of phosphors may coincide with stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based terbium (Tb), lutetium (Lu), scandium (Sc), gadolinium (Gd), or the like. In addition, Eu or the like, an activator, may be substituted with Ce, Tb, praseodymium (Pr), erbium (Er), ytterbium (Yb), or the like, according to a level of energy, and an activator provided alone or a sub-activator or the like, for modification of characteristics thereof, may additionally be used.

In further detail, in the case of a fluoride-based red phosphor, to improve reliability thereof at high temperatures and under conditions of high humidity, phosphors may be coated with fluoride not containing Mn or a phosphor surface or a fluoride-coated surface of phosphors, coated with a fluoride not containing Mn, may further be coated with an organic material. In the case of the fluoride-based red phosphor as described above, a narrow full width at half maximum (narrow FWHM) of 40 nm or less may be obtained, unlike in the case of other phosphors, and thus, the fluoride-based red phosphors may be used in high-resolution TV sets such as UHD TVs.

Figure 42:
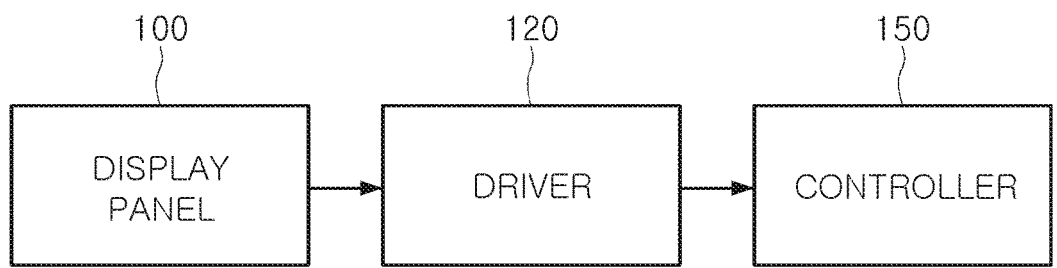
FIG. 42 is a block diagram illustrating a configuration of a display device according to an example embodiment.

FIG. 42 is a block diagram illustrating a structure of a display device according to an example embodiment.

With reference to FIG. 42, the display panel 100 illustrated in FIG. 8 may configure a display device with a panel driver 120 and a controller 150. Here, the display device may be provided as a display of various electronic devices such as TV, an electronic bulletin board, an electronic table, a large format display (LFD), a smartphone, a tablet, a desktop PC, a laptop computer, or the like.

The panel driver 120 may drive the display panel 100, and the controller 150 may control the panel driver 120. The panel driver 220 controlled through the controller 150 may be configured to independently turn each of a plurality of sub-pixels containing R (Red), G (Green), and B (Blue) on or off.

For example, the panel driver 120 transmits clock signals having driving frequencies to a plurality of sub-pixels, respectively, to turn the plurality of sub-pixels on or off, respectively. The controller 150 controls the panel driver 120 to turn a plurality of sub-pixels as a set group unit on, according to an input video signal, and thus, a desired image may be displayed in the display panel 100.

In the previous example embodiments, a display device is described as a main application example, but LED light source modules 50, 50A, 50B, and 50C employed in a display panel may be used as a light source module of various lighting apparatuses.

As set forth above, according to example embodiments, a plurality of semiconductor light emitting units are stacked in a vertical direction, thereby providing an LED light source module in which luminance is improved per unit area.

An LED display panel allowing a plurality of semiconductor light emitting units having different colors to be stacked in a vertical direction to freely adjust an area of a pixel, and further to greatly reduce an area of a pixel, and a display device including the same, may be provided.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While example embodiments have been shown and described above, it will be apparent to those skilled in the art that modifications and variations could be made without departing from the scope of the example embodiments as defined by the appended claims.

What is claimed is:

1. A light-emitting diode (LED) light source module comprising a light emitting stacked body, the light emitting stacked body comprising:
    a base insulating layer;
    a first light emitting layer, a second light emitting layer, a third light emitting layer sequentially stacked on the base insulating layer, and configured to emit light having different wavelengths, each of the first light emitting layer, the second light emitting layer, and the third light emitting layer comprising a first conductivity-type semiconductor layer, a second conductivity-type semiconductor layer, and an active layer disposed between the first conductivity-type semiconductor layer and the second conductivity-type semiconductor layer;
    a first interlayer insulating layer disposed between the first light emitting layer and the second light emitting layer; and
    a second interlayer insulating layer disposed between the second light emitting layer and the third light emitting layer,
    wherein the light emitting stacked body is divided into pixel regions defined by a partition structure passing through the first light emitting layer, the second light emitting layer, the third light emitting layer, the first interlayer insulating layer, and the second interlayer insulating layer, and
    each of the pixel regions comprises:
        a common electrode passing through the base insulating layer, the first light emitting layer, the second light emitting layer, the first interlayer insulating layer, and the second interlayer insulating layer, and connected to the first conductivity-type semiconductor layer of each of the first light emitting layer, the second light emitting layer, and the third light emitting layer;
        a first individual electrode passing through the base insulating layer, and connected to the second conductivity-type semiconductor layer of the first light emitting layer;
        a second individual electrode passing through the base insulating layer, the first light emitting layer, and the first interlayer insulating layer, and connected to the second conductivity-type semiconductor layer of the second light emitting layer; and
        a third individual electrode passing through the base insulating layer, the first light emitting layer, the second light emitting layer, the first interlayer insulating layer, and the second interlayer insulating layer, and connected to the second conductivity-type semiconductor layer of the third light emitting layer.

2. The LED light source module of claim 1, wherein the first light emitting layer, the second light emitting layer, and the third light emitting layer are configured to emit red light, green light, and blue light, respectively.

3. The LED light source module of claim 1, wherein the first light emitting layer, the second light emitting layer, and the third light emitting layer emit ultraviolet light,
    the first light emitting layer, the second light emitting layer, and the third light emitting layer comprise a first wavelength converting layer, a second wavelength converting layer, and a third wavelength converting layer disposed on upper surfaces of the first light emitting layer, the second light emitting layer, and the third light emitting layer, respectively, and
    the first wavelength converting layer, the second wavelength converting layer, and the third wavelength converting layer convert the ultraviolet light into red light, green light, and blue light, respectively.

4. The LED light source module of claim 3, wherein the first light emitting layer further comprises a first optical filter layer disposed on the first wavelength converting layer, and configured to block ultraviolet light, blue light, and green light, and
    the second light emitting layer further comprises a second optical filter layer disposed on the second wavelength converting layer, and configured to block ultraviolet light and blue light.

5. The LED light source module of claim 3, wherein the third light emitting layer further comprises a light diffusion layer disposed on the third wavelength converting layer, and configured to diffuse the light emitted by the third light emitting layer.

6. The LED light source module of claim 1, wherein the first light emitting layer, the second light emitting layer, and the third light emitting layer emit blue light,
the first light emitting layer and the second light emitting layer comprise a first wavelength converting layer and a second wavelength converting layer disposed on upper surfaces of the first light emitting layer and the second light emitting layer, respectively, and
the first wavelength converting layer and the second wavelength converting layer convert blue light into red light and green light, respectively.

7. The LED light source module of claim 6, wherein the first light emitting layer further comprises a first optical filter layer disposed on the first wavelength converting layer, and configured to block blue light and green light, and
the second light emitting layer further comprises a second optical filter layer disposed on the second wavelength converting layer, and configured to block blue light.

8. The LED light source module of claim 1, wherein the base insulating layer comprises a reflective material.

9. The LED light source module of claim 1, wherein the partition structure comprises a first partition, a second partition, and a third partition passing through the first light emitting layer, the second light emitting layer, and the third light emitting layer, respectively, and connected to each other.

10. The LED light source module of claim 1, further comprising an outer insulating layer disposed on the third light emitting layer.

11. The LED light source module of claim 1, wherein the common electrode comprises:
a first electrode disposed in the base insulating layer, and connected to the first conductivity-type semiconductor layer of the first light emitting layer;
a first conductive via connected to the first electrode, and passing through the first light emitting layer and the first interlayer insulating layer, the first conductive via being electrically insulated from the first light emitting layer;
a second electrode disposed in the first interlayer insulating layer, and connected to the first conductive via and the first conductivity-type semiconductor layer of the second light emitting layer;
a second conductive via connected to the second electrode, and passing through the second light emitting layer and the second interlayer insulating layer, the second conductive via being electrically insulated from the second light emitting layer; and
a third electrode disposed in the second interlayer insulating layer, and connected to the second conductive via and the first conductivity-type semiconductor layer of the third light emitting layer.

12. The LED light source module of claim 11, wherein the first interlayer insulating layer and the second interlayer insulating layer are disposed around the first conductive via and the second conductive via to electrically insulate the first conductive via and the second conductive via from the first light emitting layer and the second light emitting layer, respectively.

13. The LED light source module of claim 11, wherein the first individual electrode comprises a fourth electrode disposed in the base insulating layer, and connected to the second conductivity-type semiconductor layer of the first light emitting layer, and
the second individual electrode comprises:
a fifth electrode disposed in the base insulating layer, and electrically insulated from the first light emitting layer;
a third conductive via connected to the fifth electrode, and passing through the first light emitting layer and the first interlayer insulating layer, the third conductive via being electrically insulated from the first light emitting layer; and
a sixth electrode disposed in the second interlayer insulating layer, and connected to the third conductive via and the second conductivity-type semiconductor layer of the second light emitting layer.

14. The LED light source module of claim 13, wherein the first interlayer insulating layer is disposed around the third conductive via to electrically insulate the second individual electrode from the first light emitting layer.

15. The LED light source module of claim 13, wherein the third individual electrode comprises:
a seventh electrode disposed in the base insulating layer, and electrically insulated from the first light emitting layer;
a fourth conductive via connected to the seventh electrode, and passing through the first light emitting layer and the first interlayer insulating layer, the fourth conductive via being electrically insulated from the first light emitting layer;
an eighth electrode disposed in the first interlayer insulating layer, and connected to the fourth conductive via, the eighth electrode being electrically insulated from the second light emitting layer;
a fifth conductive via connected to the eighth electrode, and passing through the second light emitting layer and the second interlayer insulating layer, the fifth conductive via being electrically insulated from the second light emitting layer; and
a ninth electrode disposed in the second interlayer insulating layer, and connected to the fifth conductive via and the second conductivity-type semiconductor layer of the third light emitting layer.

16. The LED light source module of claim 15, wherein the first interlayer insulating layer and the second interlayer insulating layer are disposed around the fourth conductive via and the fifth conductive via to electrically insulate the third individual electrode from the first light emitting layer and the second light emitting layer, respectively.

17. A display device comprising:
a display panel comprising a circuit board and the LED light source module of claim 1, the LED light source module being disposed on the circuit board;
a panel driver configured to drive the display panel; and
a controller configured to control the panel driver.

* * * * *